US009062172B2

(12) United States Patent
Nakamura

(10) Patent No.: US 9,062,172 B2
(45) Date of Patent: Jun. 23, 2015

(54) RESIN COMPOSITION ADHESIVE FILM AND PREPREG CONTAINING THE SAME, MULTILAYERED PRINTED WIRING BOARD CONTAINING AN INSULATING LAYER FORMED BY CURING SUCH A RESIN COMPOSITION, SEMICONDUCTOR DEVICE CONTAINING SUCH A MULTILAYERED PRINTED WIRING BOARD, AND METHOD OF PRODUCING SUCH A RESIN COMPOSITION

(75) Inventor: Shigeo Nakamura, Kawasaki (JP)

(73) Assignee: AJINOMOTO CO., INC., Tokyo (JP)

( * ) Notice: Subject to any disclaimer, the term of this patent is extended or adjusted under 35 U.S.C. 154(b) by 36 days.

(21) Appl. No.: 12/967,344

(22) Filed: Dec. 14, 2010

(65) Prior Publication Data
US 2011/0139496 A1   Jun. 16, 2011

(30) Foreign Application Priority Data
Dec. 14, 2009   (JP) ................. 2009-282688

(51) Int. Cl.
H05K 1/03       (2006.01)
C08J 5/24       (2006.01)
B32B 7/12       (2006.01)
C08G 59/24      (2006.01)
C08L 63/00      (2006.01)
H05K 3/46       (2006.01)

(52) U.S. Cl.
CPC .............. C08J 5/24 (2013.01); *Y10T 428/287* (2015.01); B32B 7/12 (2013.01); *B32B 2559/00* (2013.01); *B32B 2605/08* (2013.01); C08G 59/245 (2013.01); *C08J 2363/00* (2013.01); *C08J 2379/04* (2013.01); C08L 63/00 (2013.01); *H05K 1/0373* (2013.01); H05K 3/4676 (2013.01); *H05K 2201/0129* (2013.01); *H05K 2201/0133* (2013.01); *H05K 2201/0209* (2013.01); *H05K 2201/0212* (2013.01)

(58) Field of Classification Search
USPC .............. 174/256, 250, 255, 257, 258, 260; 525/56, 237, 394–396; 523/400
See application file for complete search history.

(56) References Cited

U.S. PATENT DOCUMENTS

| | | | | |
|---|---|---|---|---|
| 6,217,943 | B1 * | 4/2001 | Hall et al. | 427/387 |
| 2007/0264438 | A1 * | 11/2007 | Kawai | 427/445 |
| 2008/0154006 | A1 * | 6/2008 | Amagai et al. | 526/317.1 |
| 2009/0088535 | A1 | 4/2009 | Arita et al. | |
| 2010/0108364 | A1 * | 5/2010 | He et al. | 174/255 |

FOREIGN PATENT DOCUMENTS

| | | |
|---|---|---|
| JP | 8-176274 A | 7/1996 |
| JP | 2004-277460 | 10/2004 |
| JP | 2005-240019 A | 9/2005 |
| JP | 2006-307162 A | 11/2006 |
| JP | 2008-031344 | 2/2008 |
| JP | 2009-073987 A | 4/2009 |
| JP | 2009-227992 A | 10/2009 |
| JP | 2009-235165 | 10/2009 |
| WO | WO 2008/044766 | 4/2008 |

OTHER PUBLICATIONS

K. Arita, et al., "Synthesis of Novel Naphthylene Ether Oligomer and Its Applications to Epoxy Resins for Environment-Friendly Materials", vol. 30, No. 4, 2009, pp. 192-199.
Office Action issued Mar. 18, 2014 in Japanese Patent Application No. 2010-273864 (submitting English language translation only).

* cited by examiner

*Primary Examiner* — Tremesha S Willis
(74) *Attorney, Agent, or Firm* — Oblon, McClelland, Maier & Neustadt, L.L.P.

(57) ABSTRACT

A resin composition which is low in a roughness of an insulating layer surface and capable of forming thereon a plated conductor layer having a sufficient peel strength in a wet roughing step and which is excellent in dielectric characteristics and a coefficient of thermal expansion, is disclosed. The resin composition contains a cyanate ester resin and a specified epoxy resin.

20 Claims, No Drawings

RESIN COMPOSITION ADHESIVE FILM AND PREPREG CONTAINING THE SAME, MULTILAYERED PRINTED WIRING BOARD CONTAINING AN INSULATING LAYER FORMED BY CURING SUCH A RESIN COMPOSITION, SEMICONDUCTOR DEVICE CONTAINING SUCH A MULTILAYERED PRINTED WIRING BOARD, AND METHOD OF PRODUCING SUCH A RESIN COMPOSITION

CROSS REFERENCES TO RELATED APPLICATIONS

This application claims priority to Japanese Patent Application No. 2009-282688, filed on Dec. 14, 2009.

BACKGROUND OF THE INVENTION

1. Field of the Invention

The present invention relates to a resin composition. Furthermore, the invention relates to an adhesive film, a prepreg, a multilayered printed wiring board and a semiconductor device each containing the inventive resin composition.

2. Description of the Related Art

In recent years, miniaturization and performance improvement of electronic appliances have been advanced. In multilayered wiring boards, a buildup layer is made multilayered, and microfabrication and high densification of wirings have been in high demand.

In response to this, various resin compositions have been formulated. For example, WO 08/044,766 discloses a resin composition containing a cyanate ester resin, a specified epoxy resin and a phenoxy resin. It is described that an insulating layer formed of such a composition is able to make both a low roughness and a high peel strength of a conductor layer formed by plating compatible with each other and to achieve a low coefficient of thermal expansion. But, the performance of such a resin was not always satisfactory.

In view of the foregoing, there remains a need for resin compositions which address and overcome the difficulties and limitations discussed above. The present invention solves that need.

SUMMARY OF THE INVENTION

An object of the invention is to provide a resin composition which is low in a roughness of an insulating layer surface and capable of forming thereon a plated conductor layer having a sufficient peel strength in a wet roughing step and which is excellent in dielectric characteristics and a coefficient of thermal expansion.

In order to achieve the foregoing object, the present inventors made extensive and intensive investigations. As a result, the invention has been accomplished with a resin composition containing a cyanate ester resin and a specified epoxy resin.

The invention includes the following embodiments:

[1] A resin composition comprising (A) a cyanate ester resin and (B) a naphthylene ether type epoxy resin.

[2] The resin composition asset forth above in [1], wherein when a non-volatile matter content in the resin composition is defined as 100% by mass, a content of the cyanate ester resin (A) is from 2 to 50% by mass, and a content of the naphthylene ether type epoxy resin (B) is from 1 to 40% by mass.

[3] The resin composition as set forth above in [1] or [2], further comprising (C) an inorganic filler.

[4] The resin composition as set forth above in any one of [1] to [3], further comprising (D) a curing accelerator.

[5] The resin composition as set forth above in any one of [1] to [4], further comprising (E) an epoxy resin (exclusive of the naphthylene ether type epoxy resin).

[6] The resin composition as set forth above in any one of [1] to [5], further comprising (F) an active ester curing agent.

[7] The resin composition as set forth above in [6], wherein when a non-volatile matter content in the resin composition is defined as 100% by mass, a content of the active ester curing agent (F) is from 1 to 15% by mass.

[8] The resin composition as set forth above in any one of [1] to [7], further comprising (G) at least one thermoplastic resin selected among a phenoxy resin, a polyvinyl acetal resin, a polyimide resin, a polyamide-imide resin, a polyether imide resin, a polysulfone resin, a polyether sulfone resin, a polyphenylene ether resin, a polycarbonate resin, a polyetheretherketone resin and a polyester resin.

[9] The resin composition as set forth above in [8] or any of the other embodiments described above, wherein when a non-volatile matter content in the resin composition is defined as 100% by mass, a content of the at least one thermoplastic resin (G) selected among a phenoxy resin, a polyvinyl acetal resin, a polyimide resin, a polyamide-imide resin, a polyether imide resin, a polysulfone resin, a polyether sulfone resin, a polyphenylene ether resin, a polycarbonate resin, a polyetheretherketone resin and a polyester resin is from 0.1 to 10% by mass.

[10] The resin composition as set forth above in any one of [1] to [9], further comprising (H) a rubber particle.

[11] The resin composition as set forth above in [10] or any of the other embodiments described above, wherein the rubber particle (H) is a core/shell type rubber particle in which the core is composed of polybutadiene, and the shell is composed of a copolymer of styrene and divinylbenzene.

[12] The resin composition as set forth above in [10] or any of the other embodiments described above, wherein when a non-volatile matter content in the resin composition is defined as 100% by mass, a content of the rubber particle (H) is from 1 to 10% by mass.

[13] The resin composition as set forth above in any one of [1] to [12], further comprising (J) a block isocyanate compound.

[14] The resin composition as set forth above in [13] or any of the other embodiments described above, wherein the block isocyanate compound (J) is a block isocyanate compound of 4,4'-diphenylmethane diisocyanate and cresol and/or a block isocyanate compound of tolylene diisocyanate and phenol.

[15] The resin composition as set forth above in any one of [1] to [14], wherein a peel strength is from 0.5 kgf/cm to 1.0 kgf/cm, a surface roughness is from 50 nm to 290 nm, and a coefficient of thermal expansion is from 5 ppm to 30 ppm.

[16] An adhesive film comprising a support having thereon the resin composition as set forth above in any one of [1] to [15] in a layer form.

[17] A prepreg comprising a sheet-shaped reinforcing base material having the resin composition as set forth above in any one of [1] to [15] impregnated therein.

[18] A multilayered printed wiring board comprising an insulating layer formed of a cured material of the resin composition as set forth above in any one of [1] to [15].

[19] A semiconductor device comprising the multilayered printed wiring board as set forth above in [18].

[20] A method of producing the resin composition according to any of the embodiments described above, comprising combining (A) the cyanate ester resin and (B) the naphthylene ether type epoxy resin.

With the inventive the resin composition containing a cyanate ester resin and a specified epoxy resin, it has become possible to provide a resin composition which is low in a roughness of an insulating layer surface and capable of forming thereon a plated conductor layer having a sufficient peel strength in a wet roughing step and which is excellent in dielectric characteristics and a coefficient of thermal expansion.

DETAILED DESCRIPTION OF THE INVENTION

The invention provides a resin composition comprising (A) a cyanate ester resin and (B) a naphthylene ether type epoxy resin (which may also be referred to as a naphthylene ether epoxy resin).

(A) Cyanate Ester Resin

The cyanate ester resin (A) which is used in the invention is not particularly limited, and examples thereof include cyanate ester resins of a novolak type (for example, a phenol novolak type, an alkyl phenol novolak type, etc.), cyanate ester resins of a dicyclopentadiene type, cyanate ester resins of a bisphenol type (for example, a bisphenol A type, a bisphenol F type, a bisphenol S type, etc.) and prepolymers obtained by converting a part of such a compound into a triazine. These resins may be used singly or in combinations of two or more kinds thereof. Though a weight average molecular weight of the cyanate ester resin is not particularly limited, it is preferably from 500 to 4,500, and more preferably from 600 to 3,000. The ranges described in this paragraph explicitly embrace all specific values and subranges therebetween.

Specific examples of the cyanate ester resin include bifunctional cyanate resins such as bisphenol A diisocyanate, polyphenol cyanate (oligo(3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl) methane, 1,3-bis(4-cyanatephenyl-1-(methylethylidene)) benzene, bis(4-cyanatephenyl)thioether and bis(4-cyanatephenyl)ether; polyfunctional cyanate resins derived from phenol novolak, cresol novolak, a dicyclopentadiene structure-containing phenol resin or the like; and prepolymers obtained by converting a part of such a cyanate resin into a triazine. These resins may be used singly or in combinations of two or more kinds thereof.

Examples of commercially available cyanate ester resins include a phenol novolak type polyfunctional cyanate ester resin represented by the following formula (1) (for example, PT30, manufactured by Lonza Japan Ltd., cyanate equivalent: 124); a prepolymer obtained by converting apart or the entirety of bisphenol A dicyanate into a triazine to form a trimer, which is represented by the following formula (2) (for example, BA230, manufactured by Lonza Japan Ltd., cyanate equivalent: 232); and a dicyclopentadiene structure-containing cyanate ester resin represented by the following formula (3) (for example, DT-4000 or DT-7000, manufactured by Lonza Japan Ltd.).

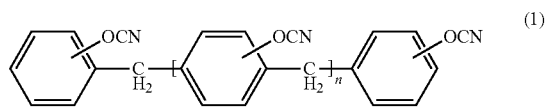

(1)

In the formula (1), n represents an arbitrary number (preferably from 0 to 20) as an average value.

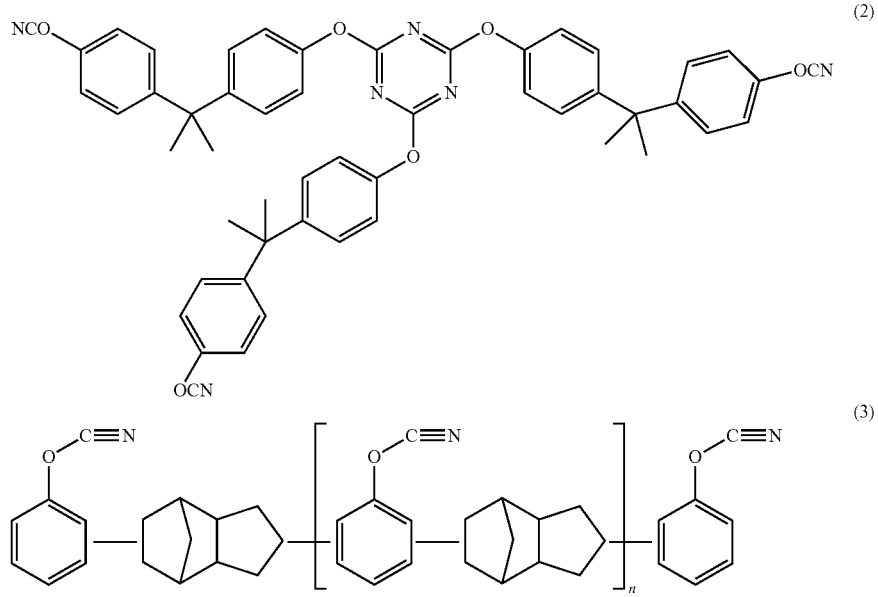

In the formula (3), n represents a number of from 0 to 5 as an average value.

Though a content of the cyanate ester resin in the resin composition of the invention is not particularly limited, from the viewpoint of preventing a lowering of the peel strength against the plated conductor layer, an upper limit value of the content of the cyanate ester resin in the resin composition is preferably not more than 50% by mass, more preferably not more than 40% by mass, still more preferably not more than 30% by mass, and yet still more preferably not more than 25% by mass relative to 100% by mass of the non-volatile matter content in the resin composition. On the other hand, from the viewpoints of preventing a lowering of the heat resistance, preventing an increase of the coefficient of thermal expansion and preventing an increase of the dielectric dissipation factor, a lower limit value of the content of the cyanate ester resin in the resin composition is preferably 2% by mass or more, more preferably 5% by mass or more, and still more preferably 8% by mass or more relative to 100% by mass of the non-volatile matter content in the resin composition. The ranges described in this paragraph explicitly embrace all specific values and subranges therebetween.

(B) Naphthylene Ether Type Epoxy Resin

Though the naphthylene ether type epoxy resin (B) which is used in the invention is not particularly limited, it can be represented by the following formula (4). n is preferably an integer of from 1 to 20, and more preferably an integer of from 1 to 10. Each R independently represents a hydrogen atom, a benzyl group, an alkyl group or a group represented by the following formula (5). In the following formula (5), each Ar independently represents a phenylene group or a naphthylene group; and m is an integer of 1 or 2. Also, from the viewpoints of preventing a lowering of the heat resistance and preventing an increase of the coefficient of thermal expansion, an upper limit value of an epoxy equivalent of the naphthylene ether type epoxy resin (B) is preferably not more than 1,000, more preferably not more than 900, still more preferably not more than 800, yet still more preferably not more than 700, even yet still more preferably not more than 600, and especially preferably not more than 500. On the other hand, from the viewpoint of preventing an increase of the dielectric dissipation factor, a lower limit value of the epoxy equivalent of the naphthylene ether type epoxy resin (B) is preferably 180 or more, more preferably 190 or more, still more preferably 200 or more, yet still more preferably 210 or more, even yet still more preferably 230 or more, and especially preferably 250 or more. The epoxy equivalent as referred to herein means a mass (g/eq) of the resin per epoxy group and is one measured in conformity with the method stipulated in JIS K7236. Specifically, by using an automatic titrator, Model GT-200, manufactured by Mitsubishi Chemical Analytech Co., Ltd., about 2 g of an epoxy resin is precisely weighed in a 200-mL beaker, 90 mL of methyl ethyl ketone is added, and after the mixture is dissolved using an ultrasonic cleaner, 10 mL of glacial acetic acid and 1.5 g of cetyl trimethyl ammonium bromide are added, followed by titration with 0.1 moles/L of a perchloric acid/acetic acid solution. The ranges described in this paragraph explicitly embrace all specific values and subranges therebetween.

As a specific example of the naphthylene ether type epoxy resin, for example, a naphthylene ether type epoxy resin represented by the following formula (6) or formula (7), as disclosed in *Journal of Network Polymer*, Japan, Vol. 30, No. 4, page 192 (2009), can be used, and it can be manufactured according to the manufacturing method described in the foregoing document. Also, commercially available products can be used, and examples of commercially available naphthylene ether type epoxy resins include EXA-7310 (epoxy equivalent: 247), EXA-7311 (epoxy equivalent: 277) and EXA-7311L (epoxy equivalent: 262), all of which are manufactured by DIC Corporation. These epoxy resins can be used singly or in combinations of two or more kinds thereof.

(4)

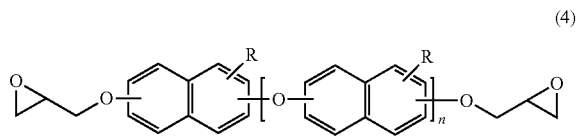

In the formula (4), n is preferably an integer of from 1 to 20, and more preferably an integer of from 1 to 10. Each R independently represents a hydrogen atom, a benzyl group, an alkyl group or a group represented by the following formula (5). The ranges described in this paragraph explicitly embrace all specific values and subranges therebetween.

(5)

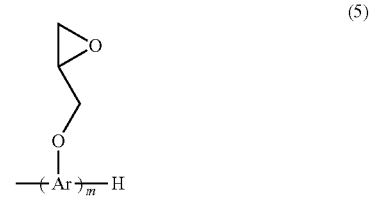

In the formula (5), each Ar independently represents a phenylene group or a naphthylene group; and m is an integer of 1 or 2.

(6)

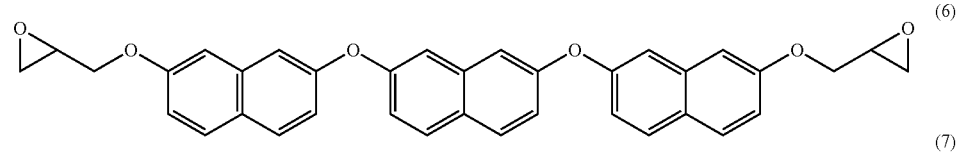

(7)

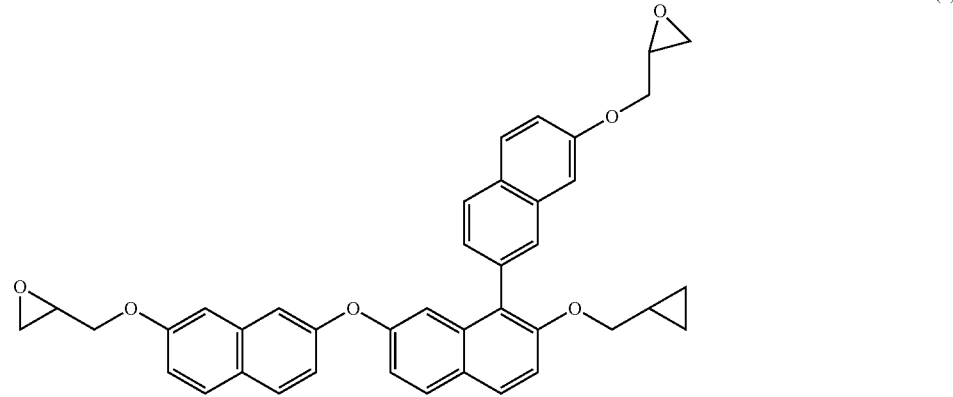

Though a content of the naphthylene ether type epoxy resin in the resin composition of the invention is not particularly limited, from the viewpoints of preventing the matter that the resin composition becomes brittle to cause a lowering of the handling properties as an adhesive film or prepreg and preventing the matter that the content of the cyanate ester resin relatively reduces to cause an increase of the coefficient of thermal expansion, an upper limit value of the content of the naphthylene ether type epoxy resin in the resin composition is preferably not more than 40% by mass, more preferably not more than 30% by mass, and still more preferably not more than 20% by mass relative to 100% by mass of the non-volatile matter content in the resin composition. On the other hand, from the viewpoint of making both a low roughness of an insulating layer surface and a high peel strength of a plated conductor layer compatible with each other in a wet roughing step, a lower limit value of the content of the naphthylene ether type epoxy resin in the resin composition is preferably 1% by mass or more, more preferably 3% by mass or more, and still more preferably 5% by mass or more relative to 100% by mass of the non-volatile matter content in the resin composition. The ranges described in this paragraph explicitly embrace all specific values and subranges therebetween.

A ratio of a cyanate group number in the cyanate ester resin to an epoxy group number in the naphthylene ether type epoxy resin is preferably from 1/0.2 to 1/2, more preferably from 1/0.3 to 1/1.5, and still more preferably from 1/0.4 to 1/1. When the equivalent ratio falls outside the foregoing range, there is a tendency that it becomes difficult to make both a low roughness of an insulating layer surface and a high peel strength of a plated conductor layer compatible with each other in a wet roughing step. The ranges described in this paragraph explicitly embrace all specific values and subranges therebetween.

The resin composition of the invention contains the component (A) and the component (B), and according to the foregoing resin composition, it is possible to make a roughness of an insulating layer surface low and form thereon a plated conductor layer having a sufficient peel strength and also to make the dielectric characteristics and coefficient of thermal expansion low.

A peel strength of the cured material of the resin composition of the invention can be grasped by a measurement method as described below in the section entitled Measurement and evaluation of peeling strength (peel strength) of plated conductor layer.

An upper limit of the peel strength of the cured material of the resin composition of the invention is preferably not more than 0.6 kgf/cm, more preferably not more than 0.7 kgf/cm, still more preferably not more than 0.8 kgf/cm, and yet still more preferably not more than 1.0 kgf/cm. A lower limit of the peel strength of the cured material of the resin composition of the invention is preferably 0.53 kgf/cm or more, and more preferably 0.55 kgf/cm or more. The ranges described in this paragraph explicitly embrace all specific values and subranges therebetween.

A surface roughness of the cured material of the resin composition of the invention can be grasped by a measurement method as described below in the section entitled Measurement and evaluation of surface roughness (Ra value) after roughing.

An upper limit value of the surface roughness of the cured material of the resin composition of the invention is preferably not more than 290 nm, more preferably not more than 270 nm, and still more preferably not more than 250 nm. A lower limit value of the surface roughness of the cured material of the resin composition of the invention is preferably 100 nm or more, more preferably 70 nm or more, and still more preferably 50 nm or more. The ranges described in this paragraph explicitly embrace all specific values and subranges therebetween.

A coefficient of thermal expansion of the cured material of the resin composition of the invention can be grasped by a measurement method as described below in the section entitled Measurement and evaluation of coefficient of thermal expansion.

An upper limit value of the coefficient of thermal expansion of the cured material of the resin composition of the invention is preferably not more than 30 ppm, more preferably not more than 28 ppm, and still more preferably not more than 25 ppm. A lower limit value of the coefficient of thermal expansion of the cured material of the resin composition of the invention is preferably 20 ppm or more, a more preferably 18 ppm or more, still more preferably 16 ppm or more, yet still more preferably 10 ppm or more, and even yet still more preferably 5 ppm or more. The ranges described in this paragraph explicitly embrace all specific values and subranges therebetween.

A dielectric dissipation factor of the cured material of the resin composition of the invention can be grasped by a measurement method as described below in the section entitled Measurement and evaluation of dielectric dissipation factor.

An upper limit value of the dielectric dissipation factor of the cured material of the resin composition of the invention is preferably not more than 0.015, more preferably not more than 0.013, and still more preferably not more than 0.011. A lower limit value of the dielectric dissipation factor of the cured material of the resin composition of the invention is preferably 0.003 or more, more preferably 0.002 or more, and still more preferably 0.001 or more. The ranges described in this paragraph explicitly embrace all specific values and subranges therebetween.

A minimum melt viscosity of the adhesive film of the resin composition of the invention can be grasped by a measurement method as described below in the section entitled Evaluation of lamination properties.

An upper limit value of the minimum melt viscosity of the adhesive film of the resin composition of the invention is preferably not more than 30,000 poises, more preferably not more than 25,000 poises, still more preferably not more than 20,000 poises, and yet still more preferably not more than 10,000 poises. A lower limit of the minimum melt viscosity of the adhesive film of the resin composition of the invention is preferably 7,000 poises or more, more preferably 6,000 poises or more, still more preferably 5,000 poises or more, yet still more preferably 4,000 poises or more, even yet still more preferably 3,000 poises or more, and especially preferably 1,500 poises or more. The ranges described in this paragraph explicitly embrace all specific values and subranges therebetween.

(C) Inorganic Filler

By further incorporating (C) an inorganic filler into the resin composition of the invention, the coefficient of thermal expansion of the insulating layer can be further lowered. The inorganic filler is not particularly limited, and examples thereof include silica, alumina, barium sulfate, talc, clay, a mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate and calcium zirconate. Of these, silica is preferable. Also, silicas such as amorphous silica, pulverized silica, molten silica, crystalline silica, synthetic silica and hollow silica are preferable, and molten silica is more preferable. Also, spherical silica is preferable as the silica. These materials can be used singly or in combinations of two or more kinds thereof.

Though an average particle size of the inorganic filler is not particularly limited, from the viewpoint of carrying out the fine wiring formation on the insulating layer, an upper limit value of the average particle size of the inorganic filler is preferably not more than 5 μm, more preferably not more than 1 μm, and still more preferably not more than 0.7 μm. On the other hand, from the viewpoint of preventing a lowering of the handling properties to be caused due to the fact that when the epoxy resin composition is formed into a resin composition varnish, a viscosity of the varnish increases, a lower limit value of the average particle size of the inorganic filler is preferably 0.05 μm or more. The ranges described in this paragraph explicitly embrace all specific values and subranges therebetween.

The average particle size of the inorganic filler can be measured by the laser diffraction/scattering method on the basis of the Mie scattering theory. Specifically, the particle size distribution of the inorganic filler is prepared on the volume basis using a laser diffraction particle size analyzer, and a median diameter thereof can be measured as an average particle size. A material obtained by ultrasonically dispersing the inorganic filler in water can be preferably used as a measurement sample. LA-500, manufactured by Horiba, Ltd. and the like can be used as the laser diffraction particle size analyzer.

The inorganic filler in the invention is preferably an inorganic filler having enhanced moisture resistance through a surface treatment with a surface treating agent such as epoxysilane coupling agents, aminosilane coupling agents, mercaptosilane based coupling agents, silane based coupling agents, organosilazane compounds and titanate based coupling agents. These materials may be used singly or in combinations of two or more kinds thereof. Specific examples of the surface treating agent include aminosilane based coupling agents such as aminopropylmethoxysilane, aminopropyltriethoxysilane, ureidopropyltriethoxysilane, N-phenylaminopropyltrimethoxysilane and N-2-(aminoethyl)aminopropyltrimethoxysilane; epoxysilane based coupling agents such as glycidoxypropyltrimethoxysilane, glycidoxypropyltriethoxysilane, glycidoxypropylmethyldiethoxysilane, glycidylbutyltrimethoxysilane and (3,4-epoxycyclohexyl)ethyltrimethoxysilane; mercaptosilane based coupling agents such as mercaptopropyltrimethoxysilane and mercaptopropyltriethoxysilane; silane based coupling agents such as methyltrimethoxysilane, octadecyltrimethoxysilane, phenyltrimethoxysilane, methacryloxypropyltrimethoxysilane, imidazole silane and triazine silane; organosilazane compounds such as hexamethyldisilazane, hexaphenyldisilazane, trisilazane, cyclotrisilazane and 1,1,3,3,5,5-hexamethylcyclotrisilazane; and titanate based coupling agents such as butyl titanate dimer, titanium octylene glycolate, diisopropoxytitanium bis(triethanolaminate), dihydroxytitanium bislactate, dihydroxybis(ammonium lactato) titanium, bis(dioctylpyrophosphate)ethylene titanate, bis (dioctylpyrophosphate)oxyacetate titanate, tri-n-butoxytitanium monostearate, tetra-n-butyl titanate, tetra(2-ethylhexyl) titanate, tetraisopropyl bis(dioctylphosphite) titanate, tetraoctyl bis(ditridecylphosphite) titanate, tetra(2,2-diallyloxymethyl-1-butyl) bis(ditridecyl)phosphite titanate, isopropyltrioctanoyl titanate, isopropyltricumylphenyl titanate, isopropyltriisostearoyl titanate, isopropylisostearoyldiacryl titanate, isopropyldimethacrylisostearoyl titanate, isopropyltri(dioctylphosphate) titanate, isopropyltridecylbenzenesulfonyl titanate, isopropyltris(dioctylpyrophosphate) titanate and isopropyltri(N-amidoethyl.aminoethyl) titanate.

In the case of blending the inorganic filler, though a content of the inorganic filler varies depending upon characteristics required for the resin composition, when a non-volatile matter content in the resin composition is defined as 100% by mass, it is preferably from 10 to 85% by mass, more preferably from 20 to 80% by mass, still more preferably from 30 to 80% by mass, and yet still more preferably from 40 to 80% by mass. When the content of the inorganic filler is too small, the coefficient of thermal expansion of the cured material tends to become high, whereas when the content of the inorganic filler is too large, the cured material tends to become brittle, or the peel strength tends to be lowered. The ranges described in this paragraph explicitly embrace all specific values and subranges therebetween.

(D) Curing Accelerator

By further incorporating (D) a curing accelerator into the resin composition of the invention, the cyanate ester resin, the epoxy resin and the like can be efficiently cured. Examples of the curing accelerator (D) which is used in the invention include metal based curing accelerators, imidazole based curing accelerators and amine based curing accelerators. These materials may be used singly or in combinations of two or more kinds thereof.

The metal based curing accelerator is not particularly limited, and examples thereof include organic metal complexes or organic metal salts of a metal such as cobalt, copper, zinc, iron, nickel, manganese and tin. Specific examples of the organic metal complex include organic cobalt complexes such as cobalt(II) acetylacetonate and cobalt(III) acetylacetonate; organic copper complexes such as copper(II) acetylacetonate; organic zinc complexes such as zinc(II) acetylacetonate; organic iron complexes such as iron(III) acetylacetonate; organic nickel complexes such as nickel(II) acetylacetonate; and organic manganese complexes such as manganese(II) acetylacetonate. Examples of the organic metal salt include zinc octylate, tin octylate, zinc naphthenate, cobalt naphthenate, tin stearate and zinc stearate. From the viewpoints of curing properties and solvent solubility, the metal based curing accelerator is preferably cobalt(II) acetylacetonate, cobalt(III) acetylacetonate, zinc(II) acetylacetonate, zinc naphthenate or iron(III) acetylacetonate, and especially preferably cobalt(III) acetylacetonate or zinc naphthenate. The metal based curing accelerators may be used singly or in combinations of two or more kinds thereof.

As to an upper limit value of an addition amount of the metal based curing accelerator, from the viewpoint of preventing a lowering of the storage stability or insulating properties of the resin composition, a content of the metal based on the metal based curing accelerator is preferably not more than 500 ppm, and more preferably not more than 200 ppm relative to 100% by mass of the non-volatile matter content in the resin composition. On the other hand, as to a lower limit value of the addition amount of the metal based curing accelerator in the resin composition, from the standpoint of preventing the matter that it becomes difficult to form the conductor layer having an excellent peel strength on an insulating layer surface of a low roughness, a content of the metal based on the metal of the metal based curing accelerator is preferably 20 ppm or more, and more preferably 30 ppm or more relative to 100% by mass of the non-volatile matter content in the resin composition. The ranges described in this paragraph explicitly embrace all specific values and subranges therebetween.

Though the imidazole based curing accelerator is not particularly limited, examples thereof include imidazole compounds and adducts of an imidazole compound and an epoxy resin such as 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, an 2,4-diamino-6-[2'-methylimidazolyl-(1')]-ethyl-s-triazine isocyanuric acid adduct, a 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline and 2-phenylimidazoline. These materials may be used singly or in combinations of two or more kinds thereof.

Though the amine based curing accelerator is not particularly limited, examples thereof include trialkylamines such as triethylamine and tributylamine; and amine compounds such as 4-dimethylaminopyridine, benzyl dimethylamine, 2,4,6-tris(dimethylaminomethyl)phenol and 1,8-diazabicyclo(5,4,0)-undecene (hereinafter abbreviated as "DBU"). These materials may be used singly or in combinations of two or more kinds thereof.

Though a content of the imidazole based curing accelerator or amine based curing accelerator as the curing accelerator is not particularly limited, it is preferably in the range of from 0.005 to 1% by mass, and more preferably in the range of from 0.01 to 0.5% by mass relative to 100% by mass of the non-volatile matter content in the resin composition. When the content of the curing accelerator is less than 0.005% by mass, the curing becomes so slow that there is a tendency that a long heat curing time is required, whereas when the content of the curing accelerator exceeds 1% by mass, there is a tendency that the storage stability of the resin composition is lowered, and the coefficient of thermal expansion of the resin composition increases. The ranges described in this paragraph explicitly embrace all specific values and subranges therebetween.

(E) Epoxy Resin (Exclusive of the Naphthylene Ether Type Epoxy Resin)

By further incorporating (E) an epoxy resin (exclusive of the naphthylene ether type epoxy resin; i.e., with the proviso that the epoxy resin is not naphthylene ether type epoxy resin) into the resin composition of the invention, handling properties of the resin composition after drying as an adhesive film or prepreg can be enhanced. Though such an epoxy resin is not particularly limited, examples thereof include a bisphenol A type epoxy resin, a bisphenol F type epoxy resin, a bisphenol S type epoxy resin, a phenol novolak type epoxy resin, an alkylphenol novolak type epoxy resin, a biphenyl type epoxy resin, an aralkyl type epoxy resin, a dicyclopentadiene type epoxy resin, a naphthalene type epoxy resin, a naphthol type epoxy resin, an epoxidized material of a condensate of a phenol and a phenolic hydroxyl group-containing aromatic aldehyde, a biphenyl aralkyl type epoxy resin, a fluorene type epoxy resin, a xanthene type epoxy resin and triglycidyl isocyanurate. These materials may be used singly or in combinations of two or more kinds thereof.

Of these, from the viewpoints of enhancing the handling properties of the resin composition after drying as an adhesive film or prepreg and making it easy to adjust the melt viscosity, it is preferable to blend an epoxy resin which is liquid at ordinary temperature and/or a crystalline bifunctional resin. Examples of commercially available liquid epoxy resins include "jER828EL" and "YL980" (bisphenol A type epoxy resins), all of which are manufactured by Japan Epoxy Resin Co., Ltd.; "jER806H" and "YL983U" (bisphenol F type epoxy resins), all of which are manufactured by Japan Epoxy Resin Co., Ltd.; "RXE21" (hydrogenated bisphenol A type epoxy resin), which is manufactured by Japan Epoxy Resin Co., Ltd.; "871" and "191P" (glycidyl ester type epoxy resins), all of which are manufactured by Japan Epoxy Resin Co., Ltd.; "604" and "630LSD" (glycidyl amine type epoxy resins), all of which are manufactured by Japan Epoxy Resin Co., Ltd.; "HP4032", "HP4032D" and "HP4032SS" (naphthalene type bifunctional epoxy resins), all of which are manufactured by DIC Corporation; "PB-3600" (epoxy resin having a butadiene structure), which is manufactured by Daicel Chemical Industries, Ltd.; Celloxide "2021P", "2081" and "3000" (alicyclic epoxy resins), all of which are manufactured by Daicel Chemical Industries, Ltd.; and "ZX-1658" (cyclohexane dimethanol type epoxy resin), which is manufactured by Tohto Kasei Co., Ltd. On the other hand, examples of commercially available crystalline bifunctional epoxy resins include "NC3100" (bifunctional biphenyl type epoxy resin-rich material), which is manufactured by Nippon Kayaku Co., Ltd.; "YX4000H", "YX4000HK" and "YL6121" (biphenyl type epoxy resins), all of which are manufactured by Japan Epoxy Resin Co., Ltd.; "YX8800" (anthracene skeleton-containing type epoxy resin), which is manufactured by Japan Epoxy Resin Co., Ltd.; and "YDC-1312", "YSLV-80XY", "YSLV-120TE" and "ZX-1598A", all of which are manufactured by Tohto Kasei Co., Ltd.

In the case of blending the epoxy resin which is liquid at ordinary temperature and/or the crystalline bifunctional epoxy resin, though a content thereof is not particularly limited, it is preferably from 1 to 20% by mass, and more preferably from 3 to 15% by mass relative to 100% by mass of the non-volatile matter content in the resin composition. When the content is less than the foregoing range, an effect for improving the handling properties as an adhesive film or prepreg tends to be not exhibited, whereas when it is more than the foregoing range, the coefficient of thermal expansion of the cured material tends to increase. The ranges described in this paragraph explicitly embrace all specific values and subranges therebetween.

In the case of blending the epoxy resin (E) (exclusive of the naphthylene ether type epoxy resin) in the resin composition of the invention, a ratio of an isocyanate group number of the isocyanate resin to an epoxy group number of the whole of the epoxy resins in the resin composition is preferably from 1/0.4 to 1/2, and more preferably from 1/0.7 to 1/1.6. When the equivalent ratio falls outside the foregoing range, there is a tendency that it becomes difficult to make both a low roughness of an insulating layer surface and a high peel strength of a plated conductor layer compatible with each other in a wet roughing step. The ranges described in this paragraph explicitly embrace all specific values and subranges therebetween.

(F) Active Ester Curing Agent

By further incorporating (F) an active ester curing agent into the resin composition of the invention, dielectric characteristics can be enhanced.

The active ester curing agent which is used in the invention refers to one having an ester group with high reactivity and having an action to cure the epoxy resin, such as a phenol ester compound, a thiophenol ester compound, an N-hydroxyamine ester compound and a compound in which a heterocyclic hydroxyl group is esterified. Though the active ester curing agent is not particularly limited, a compound having two or more active ester groups in one molecule is preferable. In particular, from the viewpoint of enhancing the heat resistance, an active ester compound obtained from a carboxylic acid compound and a hydroxy compound is more preferable, and an active ester compound obtained from a carboxylic acid compound and a phenol compound or naphthol compound is still more preferable. And an aromatic compound having two or more active ester groups in one molecule, which is obtained from a carboxylic acid compound and a phenolic hydroxyl group-containing aromatic compound is yet still more preferable, and an aromatic compound having two or more active ester groups in one molecule, which is obtained from a compound having at least two carboxylic acids in one molecule and a phenolic hydroxyl group-containing aromatic compound is even yet still more preferable. Also, the active ester compound may be linear or multibranched. Also, when the compound having at least two carboxylic acids in one molecule is an aliphatic chain-containing compound, the compatibility with the epoxy resin can be increased, and when the compound having at least two carboxylic acids in one molecule is an aromatic ring-containing compound, the heat resistance can be increased. Specific examples of the carboxylic acid compound include benzoic acid, acetic acid, succinic acid, maleic acid, itaconic acid, phthalic acid, isophthalic acid, terephthalic acid and pyromellitic acid. Of these, from the viewpoint of enhancing the heat resistance, succinic acid, maleic acid, itaconic acid, phthalic acid, isophthalic acid and terephthalic acid are preferable, and isophthalic acid and terephthalic acid are more preferable. Specific examples of the phenol compound or naphthol compound include hydroquinone, resorcin, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol and phenol novolak. Of these, from the standpoints of enhancing the heat resistance and enhancing the solubility, bisphenol A, bisphenol F, bisphenol S, methylated bisphenol A, methylated bisphenol F, methylated bisphenol S, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol and phenol novolak are preferable; catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol and phenol novolak are more preferable; α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, dicyclopentadienyl diphenol and phenol novolak are still more preferable; α-naphthol, β-naphthol, dihydroxybenzophenone, trihydroxybenzophenone, tetrahydroxybenzophenone, dicyclopentadienyl diphenol and phenol novolak are yet still more preferable; α-naphthol, β-naphthol, dicyclopentadienyl diphenol and phenol novolak are even yet still more preferable; and α-naphthol, β-naphthol and dicyclopentadienyl diphenol are especially preferable. These materials may be used singly or in combinations of two or more kinds thereof.

More specifically, a compound represented by the following formula (8) is exemplified as the active ester compound having a dicyclopentadienyl diphenol structure.

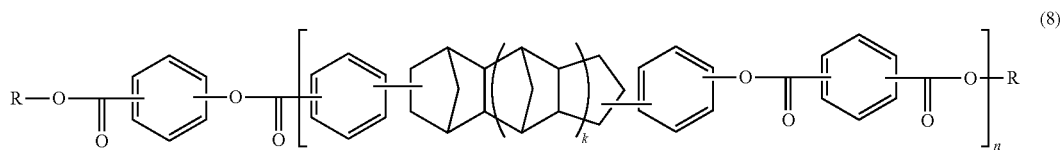

In the formula (8), R represents a phenyl group or a naphthyl group; k represents 0 or 1; and n represents an average of repeating units and is from 0.05 to 2.5.

From the viewpoints of lowering the dielectric dissipation factor and enhancing the heat resistance, R is preferably a naphthyl group, whereas k is preferably 0, and n is preferably from 0.25 to 1.5. The ranges described in this paragraph explicitly embrace all specific values and subranges therebetween.

A manufacturing method of the active ester curing agent is not particularly limited, and the active ester curing agent can be manufactured by a known method. Specifically, the active ester curing agent can be obtained by a condensation reaction of a carboxylic acid compound and a hydroxy compound. Above all, one having a structure obtained by allowing (a) a carboxylic acid compound or a halide thereof, (b) a hydroxy compound and (c) an aromatic monohydroxy compound to react with each other in an amount of a phenolic hydroxyl group of (b) of from 0.05 to 0.75 moles and an amount of (c) of from 0.25 to 0.95 moles per mole of a carboxyl group or acid halide group of (a) is preferable. Also, active ester curing agents disclosed in JP-A-2004-277460 can be used as the active ester curing agent, and commercially available products can also be used. The ranges described in this paragraph explicitly embrace all specific values and subranges therebetween.

As the commercially available active ester curing agent, active ester curing agents having a dicyclopentadienyl diphenol structure, acetylated materials of phenol novolak, benzoylated materials of phenol novolak and the like are preferable. Of these, active ester curing agents having a dicyclopentadienyl diphenol structure are more preferable. Specifically, examples of the active ester curing agents having a dicyclopentadienyl diphenol structure include EXB9451, EXB9460, EXB9460S-65T and HPC-8000-65T (all of which are manufactured by DIC Corporation, active group equivalent: about 223); examples of the acetylated materials of phenol novolak include DC808 (manufactured by Japan Epoxy Resin Co., Ltd., active group equivalent: about 149); and examples of the benzoylated materials of phenol novolak include YLH1026 (manufactured by Japan Epoxy Resin Co., Ltd., active group equivalent: about 200), YLH1030 (manufactured by Japan Epoxy Resin Co., Ltd., active group equivalent: about 201) and YLH1048 (manufactured by Japan Epoxy Resin Co., Ltd., active group equivalent: about 245). Of these, from the viewpoints of the storage stability of a varnish and the coefficient of thermal expansion of the cured material, EXB9460S is preferable.

In the case of blending the active ester curing agent (F) in the resin composition of the invention, a content of the active ester curing agent in the resin composition is preferably from 1 to 15% by mass, and more preferably from 3 to 10% by mass relative to 100% by mass of the non-volatile matter content in the resin composition. When the content of the active ester curing agent is too small, there is a tendency that a desired effect for obtaining a high peel strength in a low roughness is not exhibited, whereas when the content of the active ester curing agent is too large, there is a tendency that the coefficient of thermal expansion of the cured material increases. Also, a ratio of a total number obtained by adding an ester group number in the active ester curing agent and a cyanate group number in the cyanate ester resin to an epoxy group number in the whole of the epoxy resins is preferably from 1/0.4 to 1/2, and more preferably from 1/0.7 to 1/1.5. The ranges described in this paragraph explicitly embrace all specific values and subranges therebetween.

(G) Thermoplastic Resin

By further incorporating (G) a thermoplastic resin into the resin composition of the invention, the mechanical strength of the cured material can be enhanced, and furthermore, in the case of using the resin composition of the invention in a form of an adhesive film, the film molding capability can be enhanced, too. Examples of such a thermoplastic resin include a phenoxy resin, a polyimide resin, a polyamide-imide resin, a polyether imide resin, a polysulfone resin, a polyether sulfone resin, a polyphenylene ether resin, a polycarbonate resin, a polyetheretherketone resin and a polyester resin. These thermoplastic resins may be used singly or in combinations of two or more kinds thereof. A weight average molecular weight of the thermoplastic resin is preferably in the range of from 5,000 to 200,000. When the weight average molecular weight of the thermoplastic resin is less than this range, there is a tendency that the effect for enhancing the film molding capability or the mechanical strength is not sufficiently exhibited; whereas when it is more than this range, the compatibility with the cyanate ester resin and the naphthol type epoxy resin is not sufficient, the surface irregularity after curing becomes large, and the formation of a high-density fine wiring tends to become difficult. In this connection, the weight average molecular weight in the invention is measured by a gel permeation chromatography (GPC) method (reduced into polystyrene). Specifically, the weight average molecular weight by the GPC method can be determined at a column temperature of 40° C. by using LC-9A/RID-6A (manufactured by Shimadzu Corporation) as a measurement apparatus, Shodex K-800P/K-804L/K-804L (manufactured by Showa Denko K.K.) as a column and chloroform or the like as a mobile phase, respectively and carrying out calculation using a calibration curve of standard polystyrene. The ranges described in this paragraph explicitly embrace all specific values and subranges therebetween.

In the case of blending the thermoplastic resin (G) in the resin composition of the invention, though a content of the thermoplastic resin in the resin composition is not particularly limited, it is preferably from 0.1 to 10% by mass, and more preferably from 1 to 5% by mass relative to 100% by mass of the non-volatile matter content in the resin composition. When the content of the thermoplastic resin is too small, there is a tendency that the effect for enhancing the film molding capability or the mechanical strength is not exhibited; whereas when the content of the thermoplastic resin is too large, there is a tendency that not only the melt viscosity rises, but the roughness of the insulating layer surface after the wet roughing step increases. The ranges described in this paragraph explicitly embrace all specific values and subranges therebetween.

(H) Rubber Particle

By further incorporating (H) a rubber particle into the resin composition of the invention, the plating peel strength can be enhanced, and effects for enhancing the drill processing properties, lowering the dielectric dissipation factor and relieving the stress can be obtained, too. The rubber particle which can be used in the invention is, for example, one which is insoluble in an organic solvent used for the preparation of a varnish of the resin composition and incompatible with the cyanate ester resin and the epoxy resin as essential components. In consequence, the rubber particle is present in a dispersed state in the varnish of the resin composition of the invention. In general, such a rubber particle can be prepared by increasing the molecular weight of the rubber component to an extent that it is insoluble in the organic solvent and the resins, thereby converting it into a granular state.

Preferred examples of the rubber particle which can be used in the invention include a core/shell type rubber particle, a crosslinked acrylonitrile butadiene rubber particle, a crosslinked styrene butadiene rubber particle and an acrylic rubber particle. The core/shell type rubber particle is a rubber particle having a core layer and a shell layer, and examples thereof include a two-layer structure in which the shell layer as an external layer is constituted of a glassy polymer, and the core layer as an internal layer is constituted of a rubbery polymer; and a three-layer structure in which the shell layer as an external layer is constituted of a glassy polymer, an interlayer is constituted of a rubbery polymer, and the core layer is constituted of a vitreous polymer. The glassy polymer layer is constituted of, for example, a polymer of methyl methacrylate, etc.; and the rubbery polymer layer is constituted of, for example, a butyl acrylate polymer (butyl rubber), etc. The rubber particle may be used in combinations of two or more kinds thereof. Specific examples of the core/shell type rubber particle include Staphyloid AC3832, AC3816N, IM-401 Modified 1 and IM-401 Modified 7-17 (all of which are a trade name, manufactured by Ganz Chemical Co., Ltd.); and Metablen KW-4426 (a trade name, manufactured by Mitsubishi Rayon Co., Ltd.). Specific examples of the crosslinked acrylonitrile butadiene rubber (NBR) particle include XER-91 (average particle size: 0.5 μm, manufactured by JSR Corporation). Specific examples of the crosslinked styrene butadiene rubber (SBR) particle include XSK-500 (average particle size: 0.5 μm, manufactured by JSR Corporation). Specific examples of the acrylic rubber particle include Metablen W300A (average particle size: 0.1 μm) and W450A (average particle size: 0.2 μm) (all of which are manufactured by Mitsubishi Rayon Co., Ltd.).

An average particle size of the rubber particle to be blended is preferably in the range of from 0.005 to 1 μm, and more preferably in the range of from 0.2 to 0.6 μm. The average particle size of the rubber particle which is used in the invention can be measured by adopting a dynamic light scattering method. For example, the measurement can be carried out by uniformly dispersing the rubber particle in an appropriate organic solvent by ultrasonic waves or the like, preparing the particle size distribution of the rubber particle using a fiber-optics particle analyzer (FPAR-1000, manufactured by Otsuka Electronics Co., Ltd.) on a mass basis and defining its median diameter as the average particle size. The ranges described in this paragraph explicitly embrace all specific values and subranges therebetween.

A content of the rubber particle is preferably from 1 to 10% by mass, and more preferably from 2 to 5% by mass relative to 100% by mass of the non-volatile matter content in the resin composition. The ranges described in this paragraph explicitly embrace all specific values and subranges therebetween.

(I) Flame Retardant

By further incorporating (I) a flame retardant into the resin composition of the invention, flame retardancy can be imparted. Examples of the flame retardant include organic phosphorus based flame retardants, organic nitrogen-containing phosphorus compounds, nitrogen compounds, silicone based flame retardants and metal hydroxides. Examples of the organic phosphorus based flame retardant include phenanthrene type phosphorus compounds such as HCA, HCA-HQ and HCA-NQ, all of which are manufactured by Sanko Co., Ltd.; phosphorus-containing benzoxazine compounds such as HFB-2006M, manufactured by Showa Highpolymer Co., Ltd.; phosphoric ester compounds such as Reofos 30, 50, 65, 90, 110, TPP, RPD, BAPP, CPD, TCP, TXP, TBP, TOP, KP140 and TIBP, all of which are manufactured by Ajinomoto Fine-Techno Co., Inc., TPPO and PPQ, all of which are manufactured by Hokko Chemical Industry Co., Ltd., OP930, manufactured by Clariant AG, and PX200, manufactured by Daihachi Chemical Industry Co., Ltd.; phosphorus-containing epoxy resins such as FX289, FX305 and TX0712, all of which are manufactured by Tohto Kasei Co., Ltd.; phosphorus-containing phenoxy resin such as ERF001, manufactured by Tohto Kasei Co., Ltd.; and phosphorus-containing epoxy resins such as YL7613, manufactured by Japan Epoxy Resin Co., Ltd. Examples of the organic nitrogen-containing phosphorus compound include phosphoric ester amide compounds such as SP670 and SP703, all of which are manufactured by Shikoku Chemicals Corporation; and phosphazene compounds such as SPB100 and SPE100, all of which are manufactured by Otsuka Chemical Co., Ltd., and FP-Series, manufactured by Fushimi Pharmaceutical Co., Ltd. Examples of the metal hydroxide include magnesium hydroxides such as UD65, UD650 and UD653, all of which are manufactured by Ube Material Industries, Ltd.; and aluminum hydroxides such as B-30, B-325, B-315, B-308, B-303 and UFH-20, all of which are manufactured by Tomoe Engineering Co., Ltd.

(J) Block Isocyanate Compound

By further incorporating (J) a block isocyanate compound into the resin composition of the invention, the melt viscosity can be lowered. The block isocyanate compound is one obtained through a reaction of blocking an isocyanate with an imidazole or a phenol and can be obtained by a known method. The reaction proceeds in either a non-solvent system or a solvent system. In the case of the solvent system, it is preferable to use an aprotic solvent which is inert to the isocyanate group, for example, toluene, hexane, chloroform, methylene chloride, etc.

Though the isocyanate which is used for the synthesis of the block isocyanate compound is not particularly limited, examples thereof include monoisocyanates such as methyl isocyanate, ethyl isocyanate, propyl isocyanate, isobutyl isocyanate, hexyl isocyanate and phenyl isocyanate; alkylene diisocyanates such as methylene diisocyanate, 1,2-ethylene diisocyanate, 1,3-trimethylene diisocyanate, 1,4-tetramethylene diisocyanate, 1,6-hexamethylene diisocyanate, 1,8-octamethylene diisocyanate, 1,12-dodecamethylene diisocyanate and 2,2,4-trimethylhexamethylene diisocyanate; aliphatic diisocyanates such as 3,3'-diisocyanatodipropyl ether; alicyclic diisocyanates such as cyclopentane diisocyanate, cyclohexane diisocyanate and isophorone diisocyanate; aromatic diisocyanates such as tolylene diisocyanate, phenylene diisocyanate, xylylene diisocyanate, 4,4'-diphenylmethane diisocyanate, diphenyl ether diisocyanate, naphthalene diisocyanate, fluorene diisocyanate and 4,4'-biphenyl diisocyanate; and prepolymers having isocyanate at the both terminal ends thereof. Of these, from the viewpoints of solubility and reactivity, alicyclic diisocyanates and aromatic diisocyanates are preferable; and tolylene diisocyanate and 4,4'-biphenyl diisocyanate are more preferable from the standpoint that the solubility of a block material is good.

Though the imidazole which is used for the synthesis of the block isocyanate compound is not particularly limited, examples thereof include imidazoles in which an active hydrogen group remains, such as imidazole, 2-methylimidazole, 2-ethyl-4-methylimidazole, 2-undecylimidazole, 2-phenylimidazole and 2-phenyl-4-methylimidazole. Of these, from the standpoints that the melting point of a block material is high and that the storage stability of the resin composition is good, 2-methylimidazole, 2-phenylimidazole, 2-ethyl-4-methylimidazole and 2-undecylimidazole are preferable, and 2-phenylimidazole and 2-ethyl-4-methylimidazole are more preferable.

Though the phenol which is used for the synthesis of the block isocyanate compound is not particularly limited, examples thereof include phenol, cresol, hydroquinone, biphenol, tetramethylbiphenol, ethylidenebisphenol, bisphenol A, bisphenol F, bisphenol S, naphthalenediol, dicyclopentadiene-modified bisphenol and a reaction product of 9,10-dihydro-9-oxa-10-phosphaphenanthrene-10-oxide and hydroquinone.

Specific examples thereof include MS-50 (manufactured by Nippon Polyurethane Industry Co., Ltd., a block isocyanate compound of 4,4'-diphenylmethane diisocyanate and cresol) and AP-Stable (manufactured by Nippon Polyurethane Industry Co., Ltd., a block isocyanate compound of tolylene diisocyanate and phenol).

An upper limit value of a content of the block isocyanate compound is preferably not more than 10% by mass, more preferably not more than 9% by mass, still more preferably not more than 8% by mass, yet still more preferably not more than 7% by mass, even yet still more preferably not more than 6% by mass, and especially preferably not more than 5% by mass relative to the 100% by mass of the non-volatile matter content in the resin composition. The ranges described in this paragraph explicitly embrace all specific values and subranges therebetween.

A lower limit value of the content of the block isocyanate compound is preferably 0.1% by mass or more, more preferably 0.3% by mass or more, still more preferably 0.5% by mass or more, yet still more preferably 0.7% by mass or more, even yet still more preferably 0.9% by mass or more, and especially preferably 1.1% by mass relative to 100% by mass of the non-volatile matter content in the resin composition. The ranges described in this paragraph explicitly embrace all specific values and subranges therebetween.

Additional Components

If desired, other components can be blended in the resin composition of the invention within the range where the effects of the invention are not impaired. Examples of other components include thermosetting resins such as vinylbenzyl compounds, acrylic compounds and maleimide compounds; organic fillers such as a silicon powder, a nylon powder and a fluorocarbon powder; thickeners such as orben and benton; silicone based, fluorocarbon based or polymer based defoaming agents or leveling agents; adhesion-imparting agents such as imidazole based, thiazole based, triazole based or silane based coupling agents; and coloring agents such as Phthalocyanine Blue, Phthalocyanine Green, Iodine Green, Disazo Yellow and carbon black.

A preparation method of the resin composition of the invention is not particularly limited, and examples thereof include a method of mixing the blending components upon being optionally added with a solvent and the like by using a rotary mixer, etc.

Though the resin composition of the invention is not particularly limited with respect to an application thereof, it can be used over a wide range of the application where the resin composition is required, including insulating resin sheets such as an adhesive film and a prepreg, circuit substrates, solder resists, under fill materials, die bonding materials, semiconductor sealing materials, plugging resins and part-embedding resins. Above all, the resin composition of the invention can be suitably used for forming an insulating layer in the manufacture of a multilayered printed wiring board. Though an insulating layer can be formed by coating the resin composition of the invention in a varnish state on a circuit substrate, in general, it is industrially preferable to use the resin composition of the invention in a form of a sheet-shaped laminated material such as an adhesive film and a prepreg. From the viewpoint of lamination properties of the sheet-shaped laminated material, a softening point of the resin composition is preferably from 40 to 150° C.

Adhesive Film

The adhesive film of the invention can be manufactured by a method which is known by those skilled in the art, for example, by preparing a resin varnish of the resin composition dissolved in an organic solvent, coating this resin varnish on a support by using a die coater or the like and further drying the organic solvent by heating, blowing hot air or the like, thereby forming a resin composition layer.

The organic solvent includes, for example, ketones such as acetone, methyl ethyl ketone, cyclohexanone, etc.; acetate esters such as ethyl acetate, butyl acetate, cellosolve acetate, propylene glycol monomethyl ether acetate, carbitol acetate, etc.; carbitols such as cellosolve, butylcarbitol, etc.; aromatic hydrocarbons such as toluene, xylene, etc.; and amide type solvents such as dimethylformamide, dimethylacetamide, N-methylpyrrolidone, etc. The organic solvent may be used in combination of two or more species.

Though a drying condition is not particularly limited, the drying is carried out in such a manner that a content of the organic solvent in the resin composition layer is not more than 10% by mass, and preferably not more than 5% by mass. Though the drying condition varies depending upon the content of the organic solvent in the varnish and a boiling point of the organic solvent, for example, the resin composition layer can be formed by drying the varnish containing from 30 to 60% by mass of the organic solvent at from 50 to 150° C. for from about 3 to 10 minutes. The ranges described in this paragraph explicitly embrace all specific values and subranges therebetween.

A thickness of the resin composition layer which is formed in the adhesive film is preferably a thickness of the conductor layer or more. Since the thickness of the conductor layer which the circuit substrate has is usually in the range of from 5 to 70 μm, it is preferable that the resin composition layer has a thickness of from 10 to 100 μm. The ranges described in this paragraph explicitly embrace all specific values and subranges therebetween.

Examples of the support include various plastic films such as films of a polyolefin, for example, polyethylene, polypropylene, polyvinyl chloride, etc.; films of a polyester, for example, polyethylene terephthalate (hereinafter sometimes abbreviated as "PET"), polyethylene naphthalate, etc.; polycarbonate films; and polyimide films. Also, release papers, metal foils such as a copper foil and an aluminum foil, and the like can be used. The support and a protective film as described later may be those having been subjected to a surface treatment such as a mud treatment and a corona treatment. Also, the support and the protective film may be one having been subjected to a release treatment with a release agent such as silicone resin based release agents, alkyd resin based release agents and fluorocarbon resin based release agents.

Though a thickness of the support is not particularly limited, it is preferably from 10 to 150 μm, and more preferably from 25 to 50% μm. The ranges described in this paragraph explicitly embrace all specific values and subranges therebetween.

On the surface of the resin composition layer with which the support does not come into intimate contact, a protective film corresponding to the support can be further laminated. Though a thickness of the protective film is not particularly limited, it is, for example, from 1 to 40 μm. By laminating the protective film, attachment of dusts or the like or generation of scratches on the surface of the resin composition layer can be prevented. The adhesive film can also be wound up in a roll form and stored. The ranges described in this paragraph explicitly embrace all specific values and subranges therebetween.

Multilayered Printed Wiring Board Using the Adhesive Film

Next, an example of a method for manufacturing a multilayered printed wiring board using the thus manufactured adhesive film is described.

First of all, the adhesive film is laminated on one surface or both surfaces of a circuit substrate using a vacuum laminator. Examples of a substrate which is used for the circuit substrate include a glass epoxy substrate, a metal substrate, a polyester substrate, a polyimide substrate, a BT resin substrate and a thermosetting polyphenylene ether substrate. In this connection, the circuit substrate as referred to herein means a substrate, on one surface or both surfaces of which is formed a pattern-processed conductor layer (circuit). Also, a multilayered printed wiring board having a conductor layer and an insulating layer alternately laminated thereon, in which one surface or both surfaces of an outermost layer thereof are composed of a pattern-processed conductor layer (circuit), is included in the circuit substrate as referred to herein. In this connection, the surface of the conductor layer may be previously subjected to a roughing treating by means of a blackening treatment, copper etching or the like.

In the foregoing laminate, in the case where the adhesive film has a protective film, after removing the protective film, the adhesive film and the circuit substrate are preheated, if desired, and the adhesive film is press bonded to the circuit substrate while applying pressure and heating. In the adhesive film of the invention, a method in which the adhesive film is laminated on the circuit substrate under reduced pressure by a vacuum lamination method is suitably adopted. Though a lamination condition is not particularly limited, for example, it is preferable to carry out the lamination at a press bonding temperature (lamination temperature) of preferably from 70 to 140° C. and a press bonding pressure of preferably from 1 to 11 kgf/cm$^2$ (from $9.8 \times 10^4$ to $107.9 \times 10^4$ N/m$^2$) under a reduced pressure of not more than 20 mmHg (26.7 hPa) in terms of a pneumatic pressure. Also, the lamination method may be either a batchwise mode or a continuous mode using rolls. The vacuum lamination can be carried out using a commercially available vacuum laminator. Examples of the commercially available vacuum laminator include a vacuum applicator, manufactured by Nichigo-Morton Co., Ltd.; a vacuum pressure type laminator, manufactured by Meiki Co., Ltd.; a roll type dry coater, manufactured by Hitachi Industries Co., Ltd.; and a vacuum laminator, manufactured by Hitachi AIC Inc. The ranges described in this paragraph explicitly embrace all specific values and subranges therebetween.

Also, it is possible to carry out the lamination step of carrying out heating and pressing under reduced pressure using a general vacuum hot press machine. For example, the lamination step can be carried out by pressing a metal plate such as a heated SUS plate from the support layer side. As to a pressing condition, a degree of vacuum is usually not more than $1\times10^{-2}$ MPa, and preferably not more than $1\times10^{-3}$ MPa. Though the heating and pressing can be carried out by one stage, from the viewpoint of controlling bleeding of the resin, it is preferable to carry out the heating and pressing dividedly by two or more stages. For example, it is preferable to carry out the first-stage pressing at a temperature in the range of from 70 to 150° C. under a pressure in the range of from 1 to 15 kgf/cm$^2$ and to carry out the second-stage pressing at a temperature in the range of from 150 to 200° C. under a pressure in the range of from 1 to 40 kgf/cm$^2$. It is preferable to carry out the pressing at each stage for a period of from 30 to 120 minutes. Examples of the commercially available vacuum hot pressing machine include MNPC-V-750-5-200 (manufactured by Meiki Co., Ltd.) and VH1-1603 (manufactured by Kitagawa Seiki Co., Ltd.). The ranges described in this paragraph explicitly embrace all specific values and subranges therebetween.

The insulating layer can be formed on the circuit substrate by after laminating the adhesive film on the circuit substrate, cooling the laminate to the neighborhood of room temperature, and in the case of releasing the support, releasing the support, followed by heat curing. Though a condition of the heat curing may be properly chosen depending upon the kind and content and the like of each of the resin components in the resin composition, it is chosen preferably from a range at from 150° C. to 220° C. for from 20 minutes to 180 minutes, and more preferably from a range at from 160° C. to 200° C. for from 30 minutes to 120 minutes. The ranges described in this paragraph explicitly embrace all specific values and subranges therebetween.

In the case where after forming the insulating layer, the support has not been released before curing, the support is released here. Subsequently, if desired, the insulating layer formed on the circuit substrate is bored to form a via hole or a through-hole. Though the boring can be, for example, carried out by a known method using a drill, a laser, plasma or the like, or through a combination of these methods, if desired, boring using a laser such as a carbon dioxide gas laser and a YAG laser is the most general method.

Subsequently, the conductor layer is formed on the insulating layer by means of dry plating or wet plating. For the dry plating, a known method such as vapor deposition, sputtering and ion plating can be adopted. In the case of wet plating, first of all, the surface of the cured resin composition layer (insulating layer) is subjected to a roughing treatment with an oxidizing agent such as a permanganate (for example, potassium permanganate, sodium permanganate, etc.), a dichromate, ozone, hydrogen peroxide, sulfuric acid and nitric acid, thereby forming an irregular anchor. In particular, a sodium hydroxide aqueous solution of potassium permanganate, sodium permanganate or the like (an alkaline permanganate aqueous solution) is preferably used as the oxidizing agent. Subsequently, the conductor layer is formed by a combined method of electroless plate and electroplating. Also, the conductor layer can be formed by forming a plated resist with a reverse pattern to the conductor layer and then carrying out only electroless plating. As a method for the subsequent pattern formation, a method which is known to those skilled in the art, such as a subtractive method and a semi-additive method, can be adopted.

Prepreg

The prepreg of the invention can be manufactured by impregnating the resin composition of the invention in a sheet-shaped reinforcing base material composed of a fiber by a hot melt method or a solvent method and semi-curing it by heating. That is, the prepreg can be formed in a state where the resin composition of the invention is impregnated in a sheet-shaped reinforcing base material composed of a fiber. As the sheet-shaped reinforcing base material composed of a fiber, for example, those composed of a fiber which is commonly used for a prepreg, such as a glass cloth and an aramid fiber, can be used.

The holt melt method is a method for manufacturing a prepreg by once coating a resin without being dissolved in an organic solvent on coated paper with good release properties against the resin and laminating it on a sheet-shaped reinforcing base material, or coating a resin without being dissolved in an organic solvent directly on a sheet-shaped reinforcing base material by a die coater. Also, similar to the case of the adhesive film, the solvent method is a method in which a resin is dissolved in an organic solvent to prepare a resin varnish, and a sheet-shaped reinforcing base material is dipped in this varnish, thereby impregnating the resin varnish in the sheet-shaped reinforcing base material, followed by drying.

Multilayered Printed Wiring Board Using the Prepreg

Next, an example of a method for manufacturing a multilayered printed wiring board using the thus manufactured prepreg is described. One sheet or optionally plural sheets of the prepreg of the invention are superimposed on the circuit substrate and sandwiched by metal plates via a release film, followed by vacuum press lamination under a pressing and heating condition. As to the pressing and heating condition, it is preferable to carry out the pressing and heating under a pressure of from 5 to 40 kgf/cm$^2$ (from $49\times10^4$ to $392\times10^4$ N/m$^2$) at a temperature of from 120 to 200° C. for from 20 to 100 minutes. Also, similar to the case of the adhesive film, it is possible to carry out heat curing after laminating the prepreg on the circuit substrate by a vacuum lamination method. Thereafter, similar to the method as described above, the multilayered printed wiring board can be manufactured by roughing the cured prepreg surface and then forming the conductor layer by means of plating. The ranges described in this paragraph explicitly embrace all specific values and subranges therebetween.

Semiconductor Device

Furthermore, semiconductor chips are mounted on the conducting parts of the multilayer printed wiring board of the invention to produce a semiconductor device. The "conducting parts" means "the parts for conducting electric signals in the multilayer printed wiring boards", which may be positioned on the surface or embedded parts therein. There is no particular limitation in the semiconductor chip as far as it is an electric circuit element made of semiconductor materials.

The method for mounting a semiconductor chip in producing the semiconductor device of the invention, is not particularly limited, as far as the semiconductor chip works functionally and effectively, and specifically includes a wire bonding mounting method, a flip-chip mounting method, a method of mounting by bumpless build-up layer (BBUL), a method of mounting by anisotropic conductive film (ACF), a method of mounting by non-conductive film (NCF), and the like.

The "method of mounting by bumpless build-up layer (BBUL)" indicates "a method of mounting in which a semiconductor chip is buried directly in the concave of a multilayer printed wiring board, followed by connecting the semiconductor chip to the wiring on the printed wiring board", which mounting method is further classified roughly into the following BBUL method 1) and BBUL method 2).

BBUL method 1): Mounting a semiconductor chip in the concave of the multilayer printed wiring board with an underfilling agent.

BBUL method 2): Mounting a semiconductor chip in the concave of the multilayer printed wiring board with an adhesive film or prepreg.

The BBUL method 1) comprises specifically the following steps:

Step 1): The conductive layers are removed from the both sides of the multilayer printed wiring board, in which through-holes are formed by a laser or mechanical drill.

Step 2): An adhesive tape is stuck on one side of the multilayer printed wiring board, and the base of the semiconductor chip is disposed in the through-hole so that it is fixed on the adhesive tape. In this state, it is preferable to place the semiconductor chip at a lower position than the height of the through-hole.

Step 3): An underfilling agent is poured and filled into the space between the through-hole and the semiconductor chip to fix the semiconductor chip to the through-hole.

Step 4): Then, the adhesive tape is peeled off to expose the base of the semiconductor chip.

Step 5): On the base side of the semiconductor chip is laminated the adhesive film or prepreg of the invention to cover the semiconductor chip.

Step 6): After curing of the adhesive film or prepreg, holes are made by a laser to expose the bonding pad being present on the base of the semiconductor chip, followed by achieving the above-mentioned roughing treatment, non-electrolytic plating, and electrolytic plating to connect the wiring. If required, an adhesive film or prepreg may further be laminated.

The BBUL method 2) specifically comprises the following steps.

Step 1): Photoresist films are formed on the conductive layers on both sides of the multilayer printed wiring board, and apertures are formed only on one side of the photoresist films by means of photolithography.

Step 2): The conductive layer exposed in the apertures is removed with an etching solution to expose the insulating layer, and thereafter, the resist films on both sides are removed.

Step 3): All of the exposed insulting layers are removed and boring is carried out with a laser or drill to form concaves. It is preferred to use a laser in which the laser energy can be adjusted so that the absorption index of laser in copper decreases, and that in the insulating layer increases; in this situation, a carbon dioxide gas laser is more preferred. The use of such a laser allows removing only the insulating layer without penetrating the conductive layer on the opposite side of the aperture of the conductive layer.

Step 4): The base of the semiconductor chip is disposed at the concave so that it faces the aperture side, on which the adhesive film or prepreg of the invention is laminated from the aperture side to cover the semiconductor chip and fill up the space between the semiconductor chip and the concave. In this operation, it is preferred to put the semiconductor chip at the lower position than the height of the concave.

Step 5): After curing of the adhesive film or prepreg, holes are made by a laser to expose the bonding pad being present on the base of the semiconductor chip.

Step 6): The above-mentioned roughing treatment, non-electrolytic plating, and electrolytic plating are carried out to connect the wiring, and if required, an adhesive film or prepreg may further be laminated.

In view of miniaturization of semiconductor devices and reduction of transmission loss or in view of no influence of thermal history on the semiconductor chip because of using no solder or no strain produced in the future between the resin and solder, the method of mounting by bumpless build-up layer (BBUL) is preferably employed, and particularly, the BBUL methods 1) and 2) are more preferred, and the BBUL method 2) is even more preferred.

EXAMPLES

The invention is more specifically described below with reference to the following Examples, but it should not be construed that the invention is limited to these Examples.

<Measurement Methods and Evaluation Methods>

First of all, various measurement methods and evaluation methods are described.

Preparation of Sample for Measuring Peel Strength and Surface Roughness (Ra Value)

(1) Primer Treatment of Internal Layer Circuit Substrate:

The both surfaces of a glass cloth base material epoxy resin laminated board whose both sides thereof were cladded with copper, in which an internal layer circuit was formed (thickness of copper foil: 18 μm, substrate thickness: 0.3 mm, RS715ES, manufactured by Matsushita Electric Works, Ltd.), were dipped in CZ8100, manufactured by Mec Co., Ltd., thereby subjecting the copper surface to a roughing treatment.

(2) Lamination of Adhesive Film:

Each of the adhesive films fabricated in the Examples and Comparative Examples was laminated on each side of the internal layer circuit substrate using a batchwise vacuum pressure type laminator MVLP-500 (a trade name, manufactured by Meiki Co., Ltd.). The lamination was carried out by reducing the pressure for 30 seconds to an air pressure of not more than 13 hPa and thereafter pressing for 30 seconds at 100° C. under a pressure of 0.74 MPa.

(3) Curing of Resin Composition:

A PET film was released from the laminated adhesive film, and the resin composition was cured under a curing condition at 100° C. for 30 minutes and subsequently at 180° C. for 30 minutes, thereby forming an insulating layer.

(4) Roughing Treatment:

The internal circuit substrate having an insulating layer formed therein was dipped in, as a swelling liquid, diethylene glycol monobutyl ether-containing Swelling Dip Securiganth P, manufactured by Atotech Japan K.K. at 60° C. for 10 minutes; subsequently dipped in, as a roughing liquid, Concentrate Compact P (an aqueous solution of 60 g/L of $KMnO_4$ and 40 g/L of NaOH), manufactured by Atotech Japan K.K. at 80° C. for 20 minutes; and finally dipped in, as a neutralizing liquid, Reduction Solution Securiganth P, manufactured by Atotech Japan K.K. at 40° C. for 5 minutes. The insulating layer surface after this roughening treatment was measured for a surface roughness (Ra value).

(5) Plating by Semi-Additive Method:

In order to form a circuit on the insulating layer surface, the internal circuit substrate was dipped in a $PdCl_2$-containing electroless plating solution and subsequently dipped in an electroless copper plating liquid. After an annealing treatment by heating at 150° C. for 30 minutes, an etching resist was formed, and after the pattern formation by etching, electroplating with copper sulfate was carried out to form a conductor layer in a thickness of 30±5 μm. Subsequently, an annealing treatment was carried out at 180° C. for 60 minutes. This circuit substrate was measured for a peeling strength (peel strength) of the plated conductor layer.

Measurement and Evaluation of Peeling Strength (Peel Strength) of Plated Conductor Layer A cut was formed for a portion of 10 mm in width and 100 mm in length in the conductor layer of the circuit substrate, one end thereof was peeled and grasped by a grasping tool (AUTOCOM type testing instrument, AC-50C-SL, manufactured by TSE Co., Ltd.), and a load (kgf/cm) at the time of peeling to an extent of 35 mm in a vertical direction at a rate of 50 mm/min at room temperature was measured. The case where a value of the peel strength was 0.67 kgf/cm or more is defined as "" "⊚"; "; the case where a value of the peel strength was less than 0.67 kgf/cm and 0.60 kgf/cm or more is defined as "○"; the case where a value of the peel strength was less than 0.60 kgf/cm and 0.50 kgf/cm or more is defined as "Δ"; the case where a value of the peel strength was less than 0.50 kgf/cm is defined as "X"; and the case where the measurement was not carried out is defined as "–".

Measurement and Evaluation of Surface Roughness (Ra Value) After Roughing

An Ra value was determined from numerical values obtained in a measurement region of 121 μm×92 μm in a VSI contact mode with a 50-times lens using a non-contact type surface roughness meter (WYKO NT3300, manufactured by Veeco Instruments Inc.). Then, the surface roughness was measured by determining an average value at 10 points. The case where a value of the surface roughness was less than 250 nm is defined as "○"; the case where a value of the surface roughness was 250 nm or more and less than 350 nm is defined as "Δ"; the case where a value of the surface roughness was 350 nm or more is defined as "X"; and the case where the measurement was not carried out is defined as "–".

Measurement and Evaluation of Coefficient of Thermal Expansion

An adhesive film having the same resin composition layer as in each of the Examples and Comparative Examples was obtained in the same manner, except that in the Examples and Comparative Examples, ETFE-treated PET (Fluoroju RL50KSE, manufactured by Mitsubishi Plastics, Inc.) was used for the support. The obtained adhesive film was heat cured by heating at 190° C. for minutes, and the support was then released, thereby obtaining a sheet-shaped cured material. The cured material was cut into a specimen of about 5 mm in width and about 15 mm in length and subjected to thermomechanical analysis by the tensile load method using a thermomechanical analyzer Thermo Plus TMA8310 (manufactured by Rigaku Corporation). After the specimen was installed in the foregoing apparatus, it was continuously measured twice under a measurement condition at a load of 1 g at a temperature rise rate of 5° C./min. In the second measurement, an average of the coefficient of thermal expansion (ppm) at from 25° C. to 150° C. was calculated. The case where a value of the coefficient of thermal expansion was less than 20 ppm is defined as "" "⊚"; "; the case where a value of the coefficient of thermal expansion was 20 ppm or more and less than 31 ppm is defined as "○"; the case where a value of the coefficient of thermal expansion was 31 ppm or more and less than 35 ppm is defined as "Δ"; and the case where a value of the coefficient of thermal expansion was 35 ppm or more is defined as "X".

Evaluation of Lamination Properties

Each of the adhesive films fabricated in the Examples and Comparative Examples was laminated on a comb-tooth pattern with L (line: wiring width)/S (space: space width)=160/160 μm in a conductor thickness of 35 μm using a batchwise vacuum pressure type laminator MVLP-500 (a trade name, manufactured by Meiki Co., Ltd.). The lamination was carried out by reducing the pressure for 30 seconds to an air pressure of not more than 13 hPa and thereafter pressing for 30 seconds at 100° C. under a pressure of 0.74 MPa. It was confirmed whether or not after the lamination, air came into the resin composition layer to generate a void. Also, the PET film was released from the laminated adhesive film, and the resin composition was cured under a curing condition at 180° C. for 30 minutes, thereby forming an insulating layer on the pattern. A value of a difference in irregularities (Rt value: maximum peak-to-valley) on the pattern (between the conductor and other portions) was determined from numerical values obtained in a measurement region of 1.2 mm×0.91 mm in a VSI contact mode with a 10-times lens using a non-contact type surface roughness meter (WYKO NT3300, manufactured by Veeco Instruments Inc.). The case where after the lamination, no void was generated is defined as "○"; and the case where after the lamination, a void was generated is defined as "X". Also, the case where the difference in irregularities between the conductor and other portions was less than 5 μm is defined as "○"; and the case where the difference in irregularities between the conductor and other portions was 5 μm or more is defined as "X". Furthermore, a dynamic viscoelastic modulus was measured using Model Rheosol-G3000, measured by UBM Co., Ltd. in the range of from 60° C. as a starting temperature to 200° C. under a measurement condition at a temperature rise rate of 5° C./min at measurement temperature intervals of 2.5° C. at a vibration of 1 Hz/deg, and a minimum melt viscosity (poise) was calculated. The case where a value of the minimum melt viscosity was 1,500 poises or more and less than 3,000 poises is defined as "" "⊚⊚○"; "; the case where a value of the minimum melt viscosity was 3,000 poises or more and less than 4,000 poises is defined as "" "⊚⊚"; "; the case where a value of the minimum melt viscosity was 4,000 poises or more and less than 5,000 poises is defined as "" "⊚○"; "; the case where a value of the minimum melt viscosity was 5,000 poises or more and less than 6,000 poises is defined as "" "⊚"; "; the case where a value of the minimum melt viscosity was 6,000 poises or more and less than 7,000 poises is defined as "○"; the case where a value of the minimum melt viscosity was 7,000 poises or more and less than 30,000 poises is defined as "Δ"; and the case where a value of the minimum melt viscosity was 30,000 poises or more is defined as "X".

Measurement and Evaluation of Dielectric Dissipation Factor

An adhesive film having the same resin composition layer as in each of the Examples and Comparative Examples was obtained in the same manner, except that in the Examples and Comparative Examples, PET treated with a fluorocarbon resin based release agent (ETFE) (Fluoroju RL50KSE, manufactured by Mitsubishi Plastics, Inc.) was used for the support. The obtained adhesive film was heat cured by heating at 190° C. for 90 minutes, and the support was then released, thereby obtaining a sheet-shaped cured material. The cured material was cut out into a size of 80 mm in length and 2 mm in width, thereby preparing an evaluation sample. This evaluation sample was measured for a dielectric dissipation factor at a measurement frequency of 5.8 GHz and at a measurement temperature of 23° C. by the cavity resonance perturbation method using an HP8362B apparatus (manufactured by Agilent Technologies). The measurement was carried out regarding two specimens, and an average value thereof was calculated. The case where a value of the dielectric dissipation factor was less than 0.011 is defined as "○"; and the case where a value of the dielectric dissipation factor was 0.011 or more is defined as "Δ".

Example 1

20 parts by mass of a naphthylene ether type epoxy resin (epoxy equivalent: 277, "EXA-7311", manufactured by DIC Corporation), 15 parts by mass of a liquid bisphenol F type epoxy resin (epoxy equivalent: 169, "YL983U", manufactured by Japan Epoxy Resin Co., Ltd.), 10 parts by mass of a phosphorus-containing epoxy resin (a solution of "TX0712-EK75" (manufactured by Tohto Kasei Co., Ltd.) having a phosphorus content of 2.6% and an epoxy equivalent of about 355 and having a non-volatile matter content of 75% by mass in methyl ethyl ketone (hereinafter abbreviated as "MEK") and 10 parts by mass of a phenoxy resin (a solution of "YX6954" (manufactured by Japan Epoxy Resin Co., Ltd.) having a weight average molecular weight of 38,000 and having a non-volatile matter content of 30% by mass in MEK and cyclohexanone (1/1)) were dissolved by heating in 10 parts by mass of MEK, 5 parts by mass of cyclohexanone and 20 parts by mass of solvent naphtha while stirring. After cooling to room temperature, 20 parts by mass of a prepolymer of bisphenol A dicyanate (a solution of "BA230S75" (manufactured by Lonza Japan Ltd.) having a cyanate equivalent of about 232 and having a non-volatile matter content of 75% by mass in MEK) and 10 parts by mass of a phenol novolak type polyfunctional cyanate ester resin (a solution of "PT30" (manufactured by Lonza Japan Ltd.) having a cyanate equivalent of about 124 and having a non-volatile matter content of 80% by mass in MEK) were stirred and mixed together therewith; the mixture was further mixed with 0.4 parts by mass of an adduct of an imidazole compound and an epoxy resin (a solution of "jERcure P200H50" (manufactured by Japan Epoxy Resin Co., Ltd.) having a non-volatile matter content of 50% by mass in propylene glycol monomethyl ether) as a curing accelerator, 3 parts by mass of a 3% by mass solution of a zinc (II) naphthenate mineral spirit solution (manufactured by Wako Pure Chemical Industries, Ltd., zinc content: 8%) in anone and 75 parts by mass of spherical silica (one obtained by subjecting "SOC2" (manufactured by Admatechs Company Limited) to a surface treatment with aminosilane, average particle size: 0.5 μm); and the resulting mixture was uniformly dispersed by a high-speed rotary mixer, thereby preparing a varnish of a thermosetting resin composition.

In the non-volatile matters of the resin composition, a content of the cyanate ester resin (A) is 16% by mass; a content of the naphthylene ether type epoxy resin (B) is 14% by mass; a content of the inorganic filler (C) is 52% by mass; a content of the imidazole based curing accelerator (D) is 0.14% by mass; a content of the metal (zinc) added as the metal based curing accelerator is 50 ppm; a content of the liquid epoxy resin (E) is 10% by mass; and a content of the polymer component (G) is 2.1% by mass.

Subsequently, the foregoing resin composition varnish was uniformly coated in a thickness of the resin composition layer after drying of 40 μm on a polyethylene terephthalate film (thickness: 38 μm, hereinafter abbreviated as "PET film") using a die coater and then dried at from 80 to 110° C. (95° C. in average) for 6 minutes (residual solvent amount in the resin composition layer: about 1.5% by mass). Subsequently, the resulting PET film was wound up in a roll form while sticking a polypropylene film having a thickness of 15 μm onto the surface of the resin composition layer. The adhesive film in a roll form was slit in a width of 507 mm, thereby obtaining a sheet-shaped adhesive film having a size of 507×336 mm.

Example 2

10 parts by mass of a naphthylene ether type epoxy resin (epoxy equivalent: 277, "EXA-7311", manufactured by DIC Corporation), 10 parts by mass of a liquid naphthalene type epoxy resin (epoxy equivalent: 144, "HP4032SS", manufactured by DIC Corporation) and 5 parts by mass of a crystalline bifunctional epoxy resin (epoxy equivalent: about 185, "YX4000HK", manufactured by Japan Epoxy Resin Co., Ltd.) were dissolved by heating in 10 parts by mass of MEK, 10 parts by mass of cyclohexanone and 40 parts by mass of solvent naphtha while stirring. After cooling to room temperature, 16 parts by mass of a prepolymer of bisphenol A dicyanate (a solution of "BA230S75" (manufactured by Lonza Japan Ltd.) having a cyanate equivalent of about 232 and having a non-volatile matter content of 75% by mass in MEK) and 6 parts by mass of a phenol novolak type polyfunctional cyanate ester resin (a solution of "PT30" (manufactured by Lonza Japan Ltd.) having a cyanate equivalent of about 124 and having a non-volatile matter content of 80% by mass in MEK) were stirred and mixed together therewith; the mixture was further mixed with 12 parts by mass of an active ester curing agent (a solution of "EXB9460S-65T" (manufactured by DIC Corporation) having an active group equivalent of about 223 and having a non-volatile matter content of 65% by mass in toluene), 2 parts by mass of a 1% by mass solution of 4-dimethylaminopyridine in MEK and 4.5 parts by mass of a 1% by mass solution of cobalt(III) acetylacetonate (manufactured by Tokyo Chemical Industry Co., Ltd.) in MEK as curing accelerators, 140 parts by mass of spherical silica (one obtained by subjecting "SOC2" (manufactured by Admatechs Company Limited) to a surface treatment with aminosilane, average particle size: 0.5 μm), 5 parts by mass of "HCA-HQ" (manufactured by Sanko Co., Ltd., 10-(2,5-dihydroxyphenyl)-10-hydro-9-oxa-10-phosphaphenanthrene-10-oxide, average particle size: 2 μm) as a flame retardant and 4.5 parts by mass of Staphyloid ("AC3832", manufactured by Ganz Chemical Co., Ltd.) as a rubber particle; and the resulting mixture was uniformly dispersed by a high-speed rotary mixer, thereby preparing a varnish of a thermosetting resin composition.

In the non-volatile matters of the resin composition, a content of the cyanate ester resin (A) is 8.4% by mass; a content of the naphthylene ether type epoxy resin (B) is 5.0% by mass; a content of the inorganic filler (C) is 70% by mass; a content of the amine based curing accelerator (D) is 0.010% by mass; a content of the metal (cobalt) added as the metal based curing accelerator is 37 ppm; a content of the liquid epoxy resin and crystalline bifunctional epoxy resin (E) is 7.5% by mass; a content of the active ester curing agent (F) is 3.9% by mass; and a content of the rubber particle (H) is 2.3% by mass. Subsequently, an adhesive film was obtained in exactly the same manner as in Example 1 by using the foregoing resin composition varnish.

Example 3

10 parts by mass of a naphthylene ether type epoxy resin (epoxy equivalent: 277, "EXA-7311", manufactured by DIC Corporation), 8 parts by mass of a liquid naphthalene type epoxy resin (epoxy equivalent: 144, "HP4032SS", manufactured by DIC Corporation), 4 parts by mass of "YX4000HK" (manufactured by Japan Epoxy Resin Co., Ltd., epoxy equivalent: about 185) and 3 parts by mass of "NC3100" (manufactured by Nippon Kayaku Co., Ltd., epoxy equivalent: 258) as crystalline bifunctional epoxy resins and 5 parts by mass of a phenoxy resin (a solution of "YL7553" (manufactured by Japan Epoxy Resin Co., Ltd.) having a weight average molecular weight of 37,000 and having a non-volatile matter content of 30% by mass in MEK and cyclohexanone (1/1)) were dissolved by heating in 10 parts by mass of MEK, 10 parts by mass of cyclohexanone and 40 parts by mass of solvent naphtha while stirring. After cooling to room temperature, 16 parts by mass of a prepolymer of bisphenol A dicyanate (a solution of "BA230S75" (manufactured by Lonza Japan Ltd.) having a cyanate equivalent of about 232 and having a non-volatile matter content of 75% by mass in MEK) and 6 parts by mass of a phenol novolak type polyfunctional cyanate ester resin (a solution of "PT30" (manufactured by Lonza Japan Ltd.) having a cyanate equivalent of about 124 and having a non-volatile matter content of 80% by mass in MEK) were stirred and mixed together therewith; the mixture was further mixed with 12 parts by mass of an active ester curing agent (a solution of "EXB9460S-65T" (manufactured by DIC Corporation) having an active group equivalent of about 223 and having a non-volatile matter content of 65% by mass in toluene), 2 parts by mass of a 1% by mass solution of 4-dimethylaminopyridine in MEK and 4.5 parts by mass of a 1% by mass solution of cobalt (III) acetylacetonate (manufactured by Tokyo Chemical Industry Co., Ltd.) in MEK as curing accelerators, 140 parts by mass of spherical silica (one obtained by subjecting "SOC2" (manufactured by Admatechs Company Limited) to a surface treatment with aminosilane, average particle size: 0.5 μm) and 5 parts by mass of "HCA-HQ" (manufactured by Sanko Co., Ltd., 10-(2,5-dihydroxyphenyl)-10-hydro-9-oxa-10-phosphaphenanthrene-10-oxide, average particle size: 2 μm) as a flame retardant; and the resulting mixture was uniformly dispersed by a high-speed rotary mixer, thereby preparing a varnish of a thermosetting resin composition.

In the non-volatile matters of the resin composition, a content of the cyanate ester resin (A) is 8.6% by mass; a content of the naphthylene ether type epoxy resin (B) is 5.1% by mass; a content of the inorganic filler (C) is 71% by mass; a content of the amine based curing accelerator (D) is 0.010% by mass; a content of the metal (cobalt) added as the metal based curing accelerator is 38 ppm; a content of the liquid epoxy resin and crystalline bifunctional epoxy resin (E) is 7.0% by mass; a content of the active ester curing agent (F) is 4.0% by mass; and a content of the polymer component (G) is 0.8% by mass. Subsequently, an adhesive film was obtained in exactly the same manner as in Example 1 by using the foregoing resin composition varnish.

Example 4

A varnish of a thermosetting resin composition was prepared in exactly the same manner as in Example 1, except that in Example 1, 15 parts by mass of a naphthylene ether type epoxy resin (epoxy equivalent: 247, "EXA-7310", manufactured by DIC Corporation) was added in place of 20 parts of the naphthylene ether type epoxy resin (epoxy equivalent: 277, "EXA-7311", manufactured by DIC Corporation). In the non-volatile matters of the resin composition, a content of the cyanate ester resin (A) is 16.6% by mass; a content of the naphthylene ether type epoxy resin (B) is 11% by mass; a content of the inorganic filler (C) is 54% by mass; a content of the imidazole based curing accelerator (D) is 0.14% by mass; a content of the metal (zinc) added as the metal based curing accelerator is 52 ppm; a content of the liquid epoxy resin (E) is 10.8% by mass; and a content of the polymer component (G) is 2.2% by mass. Subsequently, an adhesive film was obtained in exactly the same manner as in Example 1 by using the foregoing resin composition varnish.

Example 5

A varnish of a thermosetting resin composition was prepared in exactly the same manner as in Example 2, except that in Example 2, 4.5 parts by mass of a rubber particle ("IM-401 Modified 7-17" (manufactured by Ganz Chemical Co., Ltd.) which is a core/shell type rubber particle in which the core is composed of polybutadiene, and the shell is composed of a copolymer of styrene and divinylbenzene) was added as the rubber particle in place of Staphyloid ("AC3832", manufactured by Ganz Chemical Co., Ltd.). In the non-volatile matters of the resin composition, a content of the cyanate ester resin (A) is 8.4% by mass; a content of the naphthylene ether type epoxy resin (B) is 5.0% by mass; a content of the inorganic filler (C) is 70% by mass; a content of the amine based curing accelerator (D) is 0.010% by mass; a content of the metal (cobalt) added as the metal based curing accelerator is 38 ppm; a content of the liquid epoxy resin and crystalline bifunctional epoxy resin (E) is 7.5% by mass; a content of the active ester curing agent (F) is 3.9% by mass; and a content of the rubber particle (H) is 2.3% by mass. Subsequently, an adhesive film was obtained in exactly the same manner as in Example 1 by using the foregoing resin composition varnish.

Example 6

A varnish of a thermosetting resin composition was prepared in exactly the same manner as in Example 2, except that in Example 2, 5 parts by mass of a block isocyanate compound ("AP-Stable", manufactured by Nippon Polyurethane Industry Co., Ltd.) was further added.

Example 7

A varnish of a thermosetting resin composition was prepared in exactly the same manner as in Example 2, except that in Example 2, 5 parts by mass of a block isocyanate compound ("MS-50", manufactured by Nippon Polyurethane Industry Co., Ltd.) was further added.

Comparative Example 1

By using a resin composition varnish which was prepared in exactly the same manner as in Example 1, except for changing 20 parts by mass of the naphthylene ether type epoxy resin (epoxy equivalent: 277, "EXA-7311", manufactured by DIC Corporation) to 20 parts by mass of a solid biphenyl aralkyl type epoxy resin (epoxy equivalent: 291, "NC3000H", manufactured by Nippon Kayaku Co., Ltd.), an adhesive film was obtained in exactly the same manner as in Example 1.

Comparative Example 2

By using a resin composition varnish which was prepared in exactly the same manner as in Example 2, except for changing 10 parts by mass of the naphthylene ether type epoxy resin (epoxy equivalent: 277, "EXA-7311", manufactured by DIC Corporation) to 10 parts by mass of a solid biphenyl aralkyl type epoxy resin (epoxy equivalent: 291, "NC3000H", manufactured by Nippon Kayaku Co., Ltd.), an adhesive film was obtained in exactly the same manner as in Example 1.

Comparative Example 3

By using a resin composition varnish which was prepared in exactly the same manner as in Example 2, except for changing 10 parts by mass of the naphthylene ether type epoxy resin (epoxy equivalent: 277, "EXA-7311", manufactured by DIC Corporation), 12 parts by mass of the active ester curing agent (a solution of "EXB9460S-65T" (manufactured by DIC Corporation) having an active group equivalent of about 223 and having a non-volatile matter content of 65% by mass in toluene) and 5 parts by mass of the flame retardant ("HCA-HQ", manufactured by Sanko Co., Ltd., 10-(2,5-dihydroxyphenyl)-10-hydro-9-oxa-10-phosphaphenanthrene-10-oxide, average particle size: 2 μm) to 10 parts by mass of a solid biphenyl aralkyl type epoxy resin (epoxy equivalent: 291, "NC3000H", manufactured by Nippon Kayaku Co., Ltd.) and 10 parts by mass of a 50% by mass solution of a biphenyl aralkyl type phenol resin (phenol equivalent: 231, "GPH-103", manufactured by Nippon Kayaku Co., Ltd.) in MEK, an adhesive film was obtained in exactly the same manner as in Example 1.

The results are shown in Table 1.

TABLE 1

| Blending components (parts by mass) | | Ex. 1 | Ex. 2 | Ex. 3 | Ex. 4 | Ex. 5 | Ex. 6 | Ex. 7 | Com. Ex. 1 | Com. Ex. 2 | Com. Ex. 3 |
|---|---|---|---|---|---|---|---|---|---|---|---|
| (A) | BA230S75 | 20 | 16 | 16 | 20 | 16 | 16 | 16 | 20 | 16 | 16 |
|  | PT-30-80M | 10 | 6 | 6 | 10 | 6 | 6 | 6 | 10 | 6 | 6 |
| (B) | EXA-7311 | 20 | 10 | 10 |  | 10 | 10 | 10 |  |  |  |
|  | EXA-7310 |  |  |  | 15 |  |  |  |  |  |  |
| (C) | SC2050-SXD | 75 | 140 | 140 | 75 | 140 | 140 | 140 | 75 | 140 | 140 |
| (D) | P200-H50 | 0.4 |  |  | 0.4 |  |  |  | 0.4 |  |  |
|  | NapZn(II) 3% An | 3 |  |  | 3 |  |  |  | 3 |  |  |
|  | Co(III) 1% MEK |  | 4.5 | 4.5 |  | 4.5 | 4.5 | 4.5 |  | 4.5 | 4.5 |
|  | DMAP-1M |  | 2 | 2 |  | 2 | 2 | 2 |  | 2 | 2 |
| (E) | HP4032SS |  | 10 | 8 |  | 10 | 10 | 10 |  | 10 | 10 |
|  | YL983U | 15 |  |  | 15 |  |  |  | 15 |  |  |
|  | YX4000HK |  | 5 | 4 |  | 5 | 5 | 5 |  | 5 | 5 |
|  | NC3000H |  |  |  |  |  |  |  | 20 | 10 | 10 |
|  | NC3100 |  |  | 3 |  |  |  |  |  |  |  |
| (F) | EXB9460S-65T |  | 12 | 12 |  | 12 | 12 | 12 |  | 12 |  |
| (G) | YX6954BH30 | 10 |  |  | 10 |  |  |  | 10 |  |  |
|  | YL7553BH30 |  |  | 5 |  |  |  |  |  |  |  |
| (H) | AC3832 |  | 4.5 |  |  |  | 4.5 | 4.5 |  | 4.5 | 4.5 |
|  | IM401-Modified 7-17 |  |  |  | 4.5 |  |  |  |  |  |  |
| (I) | HCA-HQ-HST |  | 5 | 5 |  | 5 | 5 | 5 |  | 5 |  |
|  | TX0712-EK75 | 10 |  |  | 10 |  |  |  | 10 |  |  |
| (J) | AP-Stable |  |  |  |  | 5 |  |  |  |  |  |
|  | MS-50 |  |  |  |  |  |  | 5 |  |  |  |
|  | GPH103-50M |  |  |  |  |  |  |  |  |  | 10 |
| (A) (% by mass) | | 16 | 8.4 | 8.6 | 16.6 | 8.4 | 8.2 | 8.2 | 16 | 8 | 9 |
| (B) (% by mass) | | 14 | 5.0 | 5.1 | 11 | 5 | 5 | 5 |  |  |  |
| (C) (% by mass) | | 52 | 70 | 71 | 54 | 70 | 69 | 69 | 52 | 70 | 73 |
| (D) Metal based on metal based curing accelerator (ppm) | | 50 | 37 | 38 | 52 | 38 | 37 | 37 | 50 | 37 | 39 |
| (D) Organic curing accelerator (% by mass) | | 0.14 | 0.01 | 0.01 | 0.14 | 0.01 | 0.01 | 0.01 | 0.14 | 0.01 | 0.01 |
| Liquid epoxy resin and/or crystalline bifunctional epoxy resin (% by mass) | | 10 | 7.5 | 7.7 | 10.8 | 7.5 | 7.4 | 7.4 | 10 | 8 | 8 |
| (F) (% by mass) | |  | 3.9 | 4.0 |  | 3.9 | 3.8 | 3.8 |  | 4 |  |
| (G) (% by mass) | | 2.1 |  | 0.8 | 2.2 |  |  |  | 2.1 |  |  |
| (H) (% by mass) | |  | 2.3 |  |  | 2.3 | 2.2 | 2.2 |  | 2.3 | 2.4 |
| [Cyanate group number in (A)]/[Cyanate group number in (B)] | | 1/0.58 | 1/0.41 | 1/0.41 | 1/0.49 | 1/0.41 | 1/0.41 | 1/0.41 |  |  |  |
| [Cyanate group number in (A)]/(Epoxy group number in the whole of epoxy resins) | | 1/1.47 | 1/1.52 | 1/1.40 | 1/1.38 | 1/1.52 | 1/1.52 | 1/1.52 | 1/1.45 | 1/1.51 | 1/1.51 |
| {[Cyanate group number inf (A)] + [Ester group number in active ester curing agent of (F)]}/(Epoxy group number in the whole of epoxy resins) | | 1/1.47 | 1/1.09 | 1/1.00 | 1/1.38 | 1/1.09 | 1/1.09 | 1/1.09 | 1/1.45 | 1/1.08 | 1/1.51 |
| Surface roughness Ra (nm) | | ○ (200) | ○ (210) | ○ (190) | Δ (270) | ○ (180) | ○ (220) | ○ (230) | X (360) | X (390) | — |
| Peel strength (kgf/cm) | | ○ (0.66) | ○ (0.61) | ⊚ (0.69) | ○ (0.60) | Δ (0.59) | Δ (0.50) | Δ (0.57) | Δ (0.59) | X (0.49) | — |
| Coefficient of thermal expansion (ppm) | | Δ (30) | ⊚ (18) | ⊚ (19) | ○ (28) | ⊚ (18) | ○ (20) | ⊚ (18) | X (33) | ○ (21) | ○ (24) |
| Lamination properties | Void | ○ | ○ | ○ | ○ | ○ | ○ | ○ | ○ | ○ | X |
|  | Irregularity | ○ | ○ | ○ | ○ | ○ | ○ | ○ | ○ | ○ | X |
|  | Minimum melt viscosity (poises) | ⊚⊚○ (2700) | ○ (6100) | ⊚ (5300) | ⊚⊚ (3200) | ○ (5600) | ⊚○ (4800) | ⊚⊚ (3900) | ⊚⊚ (3100) | Δ (7200) | X (51000) |
| Dielectric dissipation factor | | Δ (0.011) | ○ (0.008) | ○ (0.008) | Δ (0.011) | ○ (0.007) | ○ (0.008) | ○ (0.007) | Δ (0.011) | ○ (0.008) | ○ (0.009) |

From the results shown in Table 1, the adhesive films obtained in Examples 1, 2, 3 and 4 exhibited such excellent characteristics that they have a minimum melt viscosity suitable for the lamination; and that the formed insulating layers are low in the dielectric dissipation factor and coefficient of thermal expansion and have a low roughness of less than 300 nm in terms of a surface roughness and a high peel strength of 0.6 kgf/cm or more. In Example 5, it is noted that by using a specified rubber particle, the surface roughness and dielectric dissipation factor are lowered, and the lamination properties are enhanced. In Examples 6 and 7, it is noted that by using the block isocyanate compound, the minimum melt viscosity is lowered, and the lamination properties are conspicuously enhanced. On the other hand, though the adhesive films obtained in Comparative Examples 1 and 2 were not problematic in the lamination properties, the formed insulating layers had a large surface roughness and a low peel strength. Furthermore, in Comparative Example 1, the coefficient of thermal expansion was also large. In Comparative Example 3, the film did not have lamination properties. In this connection, though HCA-HQ which is used as the flame retardant in Examples 2 and 3 and Comparative Example 2 has a hydroquinone structure having two phenolic hydroxyl groups, it is noted that since this flame retardant is formed into a sparingly soluble finely divided solid, it does not deteriorate the laminate properties.

INDUSTRIAL APPLICABILITY

The present invention provides a resin composition, an adhesive film, a prepreg, a multilayered printed wiring board and a semiconductor device, each of which is low in a roughness of an insulating layer surface and capable of forming thereon a plated conductor layer having a sufficient peel strength in a wet roughing step and which is excellent in dielectric characteristics and a coefficient of thermal expansion. In addition, the present invention provides products comprising the materials described above, including electrical products such as computers, cellular phones, digital cameras, televisions, etc., and vehicles such as motorbikes, motorcars, electric cars, ships, airplanes, etc.

This application claims priority to Japanese Patent Application No. 282688/2009, filed on Dec. 14, 2010, and incorporated herein by reference in its entirety.

What is claimed is:

1. A resin composition, comprising (A) a cyanate ester resin, (B) a naphthylene ether type epoxy resin, (C) an inorganic filler, and (F) an active ester curing agent,
   wherein said naphthylene ether type epoxy resin contains at least one ether linkage directly connecting two naphthylene rings,
   wherein, when a non-volatile matter content in said resin composition is defined as 100% by mass, said inorganic filler is present in an amount of 52% or more by mass,
   wherein a cured material of the resin composition has a surface roughness of 270 nm or less,
   wherein the cured material of the resin composition has a dielectric dissipation factor of 0.008 or less, and
   wherein said (F) an active ester curing agent is a phenol ester compound, a thiophenol ester compound, an N-hydroxyamine ester compound, or a compound in which a heterocyclic hydroxyl group is esterified.

2. The resin composition according to claim 1, wherein when a non-volatile matter content in the resin composition is defined as 100% by mass, a content of the cyanate ester resin (A) is from 2 to 50% by mass, and a content of the naphthylene ether type epoxy resin (B) is from 1 to 40% by mass.

3. The resin composition according to claim 1, further comprising (D) a curing accelerator.

4. The resin composition according to claim 1, further comprising (E) an epoxy resin, in addition to said naphthylene ether type epoxy resin.

5. The resin composition according to claim 1, wherein when a non-volatile matter content in the resin composition is defined as 100% by mass, a content of the active ester curing agent (F) is from 1 to 15% by mass.

6. The resin composition according to claim 1, further comprising (G) at least one thermoplastic resin selected from the group consisting of a phenoxy resin, a polyvinyl acetal resin, a polyimide resin, a polyamide-imide resin, a polyether imide resin, a polysulfone resin, a polyether sulfone resin, a polyphenylene ether resin, a polycarbonate resin, a polyetheretherketone resin and a polyester resin.

7. The resin composition according to claim 6, wherein when a non-volatile matter content in the resin composition is defined as 100% by mass, a content of the at least one thermoplastic resin (G) selected from the group consisting of a phenoxy resin, a polyvinyl acetal resin, a polyimide resin, a polyamide-imide resin, a polyether imide resin, a polysulfone resin, a polyether sulfone resin, a polyphenylene ether resin, a polycarbonate resin, a polyetheretherketone resin and a polyester resin is from 0.1 to 10% by mass.

8. The resin composition according to claim 1, further comprising (H) a rubber particle.

9. The resin composition according to claim 8, wherein the rubber particle (H) is a core/shell type rubber particle in which the core is composed of polybutadiene, and the shell is composed of a copolymer of styrene and divinylbenzene.

10. The resin composition according to claim 8, wherein when a non-volatile matter content in the resin composition is defined as 100% by mass, a content of the rubber particle (H) is from 1 to 10% by mass.

11. The resin composition according to claim 1, further comprising (J) a block isocyanate compound.

12. The resin composition according to claim 11, wherein the block isocyanate compound (J) is a block isocyanate compound of 4,4'-diphenylmethane diisocyanate and cresol and/or a block isocyanate compound of tolylene diisocyanate and phenol.

13. The resin composition according to claim 1, wherein a cured material of the resin composition has a peel strength of from 0.5 kgf/cm to 1.0 kgf/cm, a surface roughness of from 50 nm to 290 nm and a coefficient of thermal expansion of from 5 ppm to 30 ppm.

14. An adhesive film comprising a support having thereon the resin composition according to claim 1 in a layer form.

15. A prepreg comprising a sheet-shaped reinforcing base material having the resin composition according to claim 1 impregnated therein.

16. A multilayered printed wiring board comprising an insulating layer formed of a cured material of the resin composition according to claim 1.

17. A semiconductor device comprising at least one multilayered printed wiring board according to claim 16.

18. A method of producing a resin composition according to claim 1, comprising combining (A) said cyanate ester resin, (B) said naphthylene ether type epoxy resin, (C) said inorganic filler, and (F) said active ester curing agent.

19. The resin composition according to claim 1, wherein when a non-volatile matter content in said resin composition is defined as 100% by mass, said inorganic filler (C) is present in an amount of 52% to 71%.

20. The resin composition according to claim 1, wherein said cured material of the resin composition has a surface roughness of 210 nm or less.

* * * * *